United States Patent [19]
Sato

[11] Patent Number: 5,949,407
[45] Date of Patent: Sep. 7, 1999

[54] REMOTE CONTROL SYSTEM

[75] Inventor: Kazuhiro Sato, Tokyo, Japan

[73] Assignee: Sony Corporation, Japan

[21] Appl. No.: 08/510,937

[22] Filed: Aug. 3, 1995

Related U.S. Application Data

[63] Continuation of application No. 08/102,718, Aug. 6, 1993, abandoned.

[30] Foreign Application Priority Data

Aug. 10, 1992 [JP] Japan .................................. 4-232624

[51] Int. Cl.$^6$ .................................. G09G 5/00; H04N 5/44
[52] U.S. Cl. .......................... 345/169; 345/146; 348/734; 359/146
[58] Field of Search ...................... 345/156, 157, 345/158, 169, 146, 145, 160; 348/114, 734, 569; 463/37, 39; 359/146, 143

[56] References Cited

U.S. PATENT DOCUMENTS

| | | | |
|---|---|---|---|
| 4,746,919 | 5/1988 | Reitmeier | 345/169 |
| 4,755,883 | 7/1988 | Uehira | 348/734 |
| 5,146,210 | 9/1992 | Heberle | 348/146 |
| 5,349,460 | 9/1994 | Ogasahara et al. | 348/734 |
| 5,367,316 | 11/1994 | Ikezaki | 348/734 |
| 5,371,553 | 12/1994 | Kawamura et al. | 348/734 |
| 5,398,074 | 3/1995 | Duffield et al. | 348/734 |

*Primary Examiner*—Lun-Yi Lao
*Attorney, Agent, or Firm*—Rader, Fishman & Grauer; Ronald P. Kananen

[57] ABSTRACT

A versatile remote control system including a three-button remote controller is adapted to control multiple devices. The remote control system display operation pictures in one area of a display screen such that the operation pictures do not obstruct a video image being displayed simultaneously on the display screen. The operation pictures are selected using the remote controller such that command codes corresponding to the selected operation picture are transmitted to the corresponding device to perform the controlling operation.

12 Claims, 24 Drawing Sheets

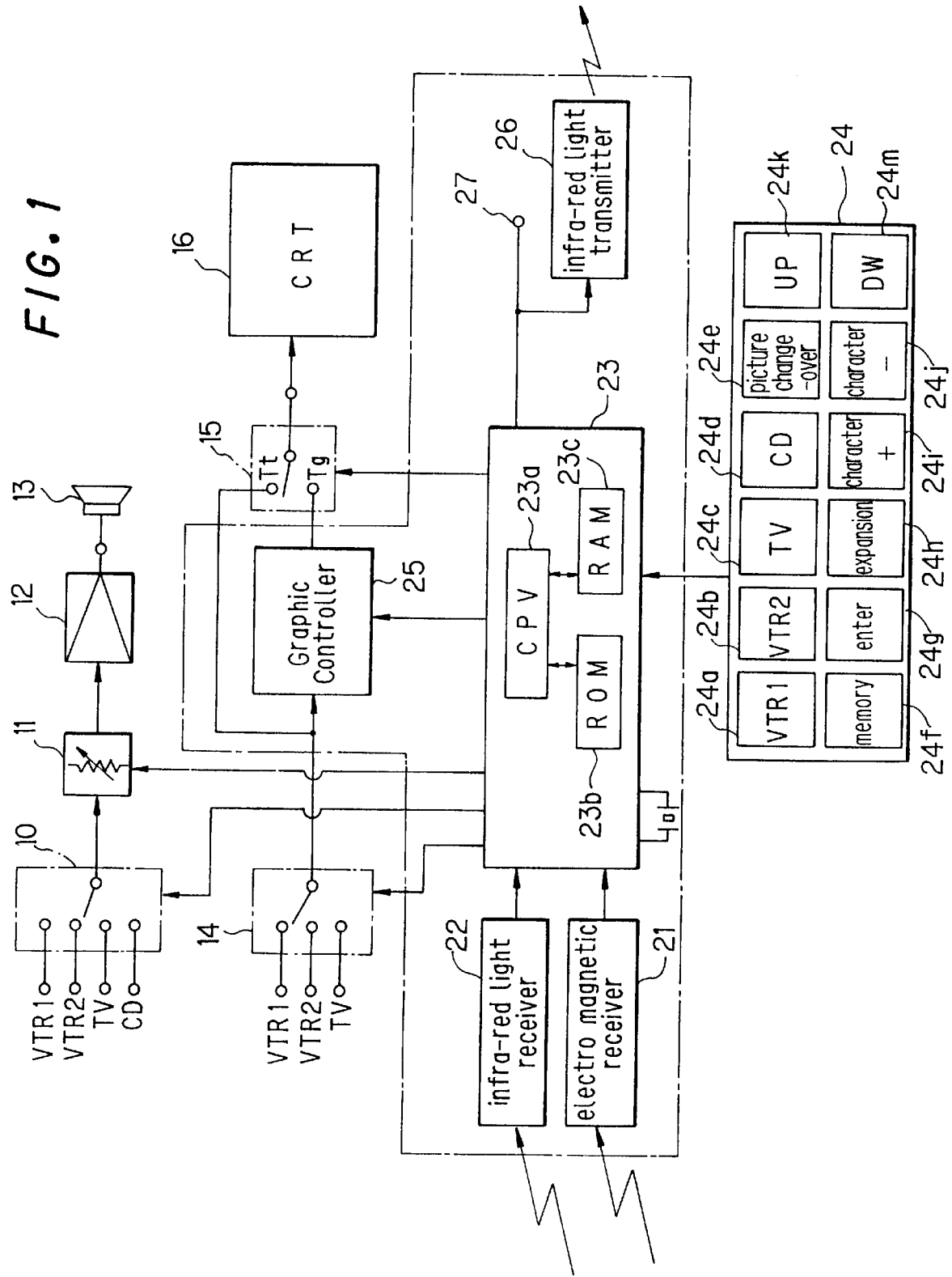

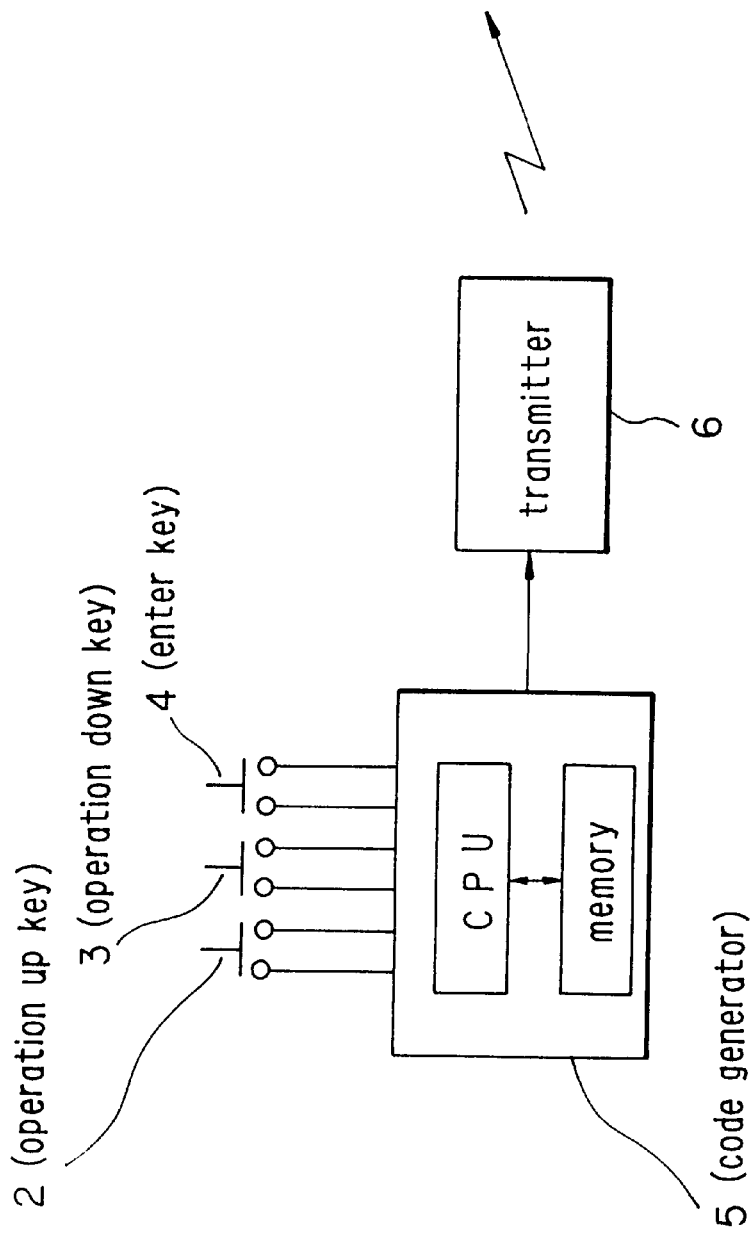
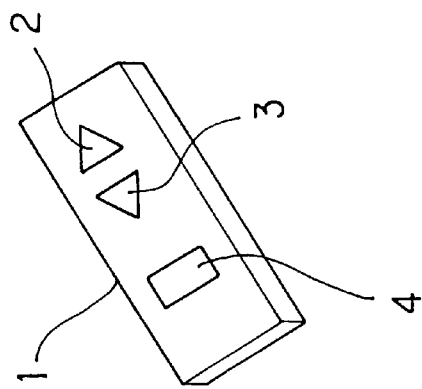

FIG. 12

|  | MSB | | | | | | | LSB | address (B) | | | |
|---|---|---|---|---|---|---|---|---|---|---|---|---|
|  | 0 | 0 | 0 | 0 | 0 | 0 | 0 | 0 | 0 | 0 | 0 | 0 |
| a → | 1 | 0 | 0 | 0 | 1 | 0 | 1 | 0 | 0 | 0 | 0 | 1 |
| b → | 0 | 0 | 0 | 1 | 0 | 1 | 0 | 0 | 0 | 0 | 1 | 0 |
| c → | 1 | 0 | 0 | 0 | 1 | 0 | 1 | 0 | 0 | 0 | 1 | 1 |
| d → | 0 | 0 | 0 | 0 | 1 | 0 | 1 | 0 | 0 | 1 | 0 | 0 |
| e → | 1 | 0 | 0 | 0 | 1 | 0 | 1 | 0 | 0 | 1 | 0 | 1 |

FIG. 19

| display | | designated code | command code (category) | (data) |
|---|---|---|---|---|
| VTR1 | ◁◁ | 0 0 0 0 | 1 1 0 1 | 1 1 1 1 |
| | ▷ | 0 0 0 1 | 1 1 0 1 | 0 0 1 1 |
| | ▷▷ | 0 0 1 0 | 1 1 0 1 | 1 0 1 0 |
| | □ | 0 0 1 1 | 1 1 0 1 | 0 0 0 0 |
| | ‖ | 0 1 0 0 | 1 1 0 1 | 1 0 0 0 |
| | REC | 0 1 0 1 | 1 1 0 1 | 0 0 0 1 |
| CD | ◁◁◁ | 0 1 1 0 | 0 1 0 1 | 1 1 1 1 |
| | ▷▷▷ | 0 1 1 1 | 0 1 0 1 | 1 0 1 0 |
| | ◁◁ | 1 0 0 0 | 0 1 0 1 | 0 1 0 1 |

Column groupings: CRT54 (display); ROM52b or RAM52c (designated code); memory area 39 (command code).

REMOTE CONTROL SYSTEM

This application is a continuation of application Ser. No. 08/102,718 filed Aug. 6, 1993, now abandoned.

BACKGROUND OF THE INVENTION

1. Field Of The Invention

The present invention relates to a remote control system suitable for use with systems such as, for example, audio visual systems.

2. Description Of The Related Art

Recently, remote controllers have come to be used to carry out the remote operation of electronic equipment such as audio visual equipment like VTRs, television receivers and compact disc players, or air conditioners and lighting equipment.

Also, as having a remote controller for the exclusive operation of each of the respective items of equipment proved to be troublesome for the user, remote controllers with a learning function for storing the various command codes have been provided so that complicated electronic equipment which is troublesome to operate can be operated by using one remote controller.

However, if the equipment functions are increased together with the operation contents, it becomes necessary to have a large number of operating keys on the remote controller. Also, for the case where there is a learning function, if a large amount of equipment is to be handled, a large number of operating keys are again necessary. To this end, remote controllers such as, for example, that shown in FIG. 20 with a large number of operating keys, were set up. Unfortunately, when it was wished to operate a key, it was very difficult to know which key to press, so that changing operations became very difficult.

Further, it was necessary to look at the remote controller during operations in order to discriminate between the large number of operating keys. This meant that, for example, operating the remote controller while looking at the picture, without looking down at the remote controller proved to be very difficult.

SUMMARY OF THE INVENTION

As the present invention sets out to solve these problems, its object is to provide a remote control system which is capable of operating the various functions of a large number of electronic equipments in a dramatically easier manner by limiting the number of keys for the remote controller to a minimum.

Namely, a remote control system is made up of: a remote controller taken as an input means for transmitting position designation information according to a user's operation through a cable or by a wireless means; receiving means for receiving the position designation information transmitted from the input means; storage means storing various command codes; display control means for controlling an operation picture signal and a position designation picture signal indicating one operation picture, corresponding to some or all of the various command codes stored in the storage means, based on the position designation information received from the remote controller by the receiving means; command generating means for selecting and outputting a desired command code from the command codes stored in the storage means, based on the position designation information received by the receiving means; and transmitting means for transmitting, through a cable or by a wireless means, the command code, which is outputted from the command generating means to an equipment or part to be controlled.

In particular, the basic system may further comprise a picture signal inputting means for providing a picture signal and a display means for displaying the picture signal inputted from said picture signal inputting means, wherein the display control means displays on the screen a position designation picture to indicate one operation picture from the inputted picture signal with and the picture signal which it may be changed over.

Also, in order to have a new command learning function, the basic structure may further comprise a character inputting means for inputting character information; external command inputting means for receiving and inputting command codes output from the external equipment, the display control means being operable to output an operation picture signal corresponding to a region of the storage means where a command code is not stored so that the character information inputted from the character inputting means can be displayed in the operation picture, and the storage means storing the command code inputted from the external command code inputting means in a region where command code is not stored, so as to correspond with an operation picture displayed according to a position designation picture designated by the inputted position designation information.

Further, in order to have a learning function which can re-write and store command codes, the construction may further comprise a display control means being operable to control an operation picture signal and a position designation picture signal indicating one operation picture, corresponding to some or all of the various command codes stored in the storage means, based on the inputted position designation information, and the storage means being operable to rewrite the command code stored so as to correspond with an operation picture displayed according to a position designation picture designated by the inputted position designation information with a command code inputted from the external command inputting means.

Also, the construction may have input selector means for selecting and outputting one signal from the signals provided by a plurality of connected equipments and selector operating means for carrying out the selecting operation for the input selector means, wherein the display control means, is operable, in response to the operation of the selector operating means, to output operation picture signals corresponding to the one or more command codes stored in the memory means as the command code or codes for the equipment selected by the input selector means.

Also, the storage means could contain at least the command codes for carrying out the selecting operation for the input selecting means, the display control means being operable to output an operation picture signal corresponding to the command code for the selecting operation of the input selecting means based on the position designation information transmitted from the input means and received by the receiving means.

Additionally, the storage means could store command codes for carrying out the selecting operation of the input selecting means and command codes for each item of connected equipment, the display control means being operable to display outputs in separate display positions, for a first operation picture signal corresponding to a command code for the selecting operation of the input selecting means, and a second operation picture signal corresponding to a command code for each connected equipment, the input selecting means being operable to perform the selecting operation for a designation while one from the operation pictures in the first operation picture signal is being designated by a position designation picture based on position designation information received at the receiving means from the input means, so that for the second operation picture signal, an operation picture signal corresponding to the command code for the equipment selected by the selecting means is outputted by the display control means.

Also, a remote control system could be provided having input means with a receiving area for receiving designation code information, a storage area for storing various command codes and a transmission area for transmitting signals through a cable or by wireless means, the input means being operable to generate position designation information, for transmitting from the transmission area through a cable or by wireless means, predetermined command codes read out from the storage area in response to inputted designation code information; receiving means for receiving the position designation information transmitted from the input means; storage means for storing designation code information corresponding to various command codes stored in the storage area of the input means; display control means for controlling an operation picture signal and a position designation picture signal indicating one operation picture, corresponding to some or all of the various command codes stored in the storage area inside the input means, based on the position designation information received by the receiving means; designation code information generating means for reading and outputting from the storage means designation code information corresponding to an operation picture indicated by a position designation picture designated from command code stored in the memory area of the input means based on position designation information received by the receiving means; and transmission means for transmitting designation code information outputted from the designation code information generating means to the receiving area of the input means through a cable or by wireless means.

In this case, the designation code information is an address code for the region of the storage area for the input means in which the command code intended to be read out is stored.

Also, the position designation information and the command codes are selectively supplied to the transmission area for the input means at different times.

BRIEF DESCRIPTION OF THE DRAWINGS

FIG. 1 is a view describing the structure of a position designation input area for a first embodiment of the present invention;

FIG. 2(*a*) is an external view and FIG. 2(*b*) is a view describing the internal structure of a remote controller for this first embodiment;

FIG. 12 is a description of the command code storage conditions for this embodiment;

FIG. 19 is a view describing the conditions corresponding to the position designation code and command code occurring in this second embodiment.

DETAILED DESCRIPTION OF THE PREFERRED EMBODIMENTS

First Embodiment

Figure 3:
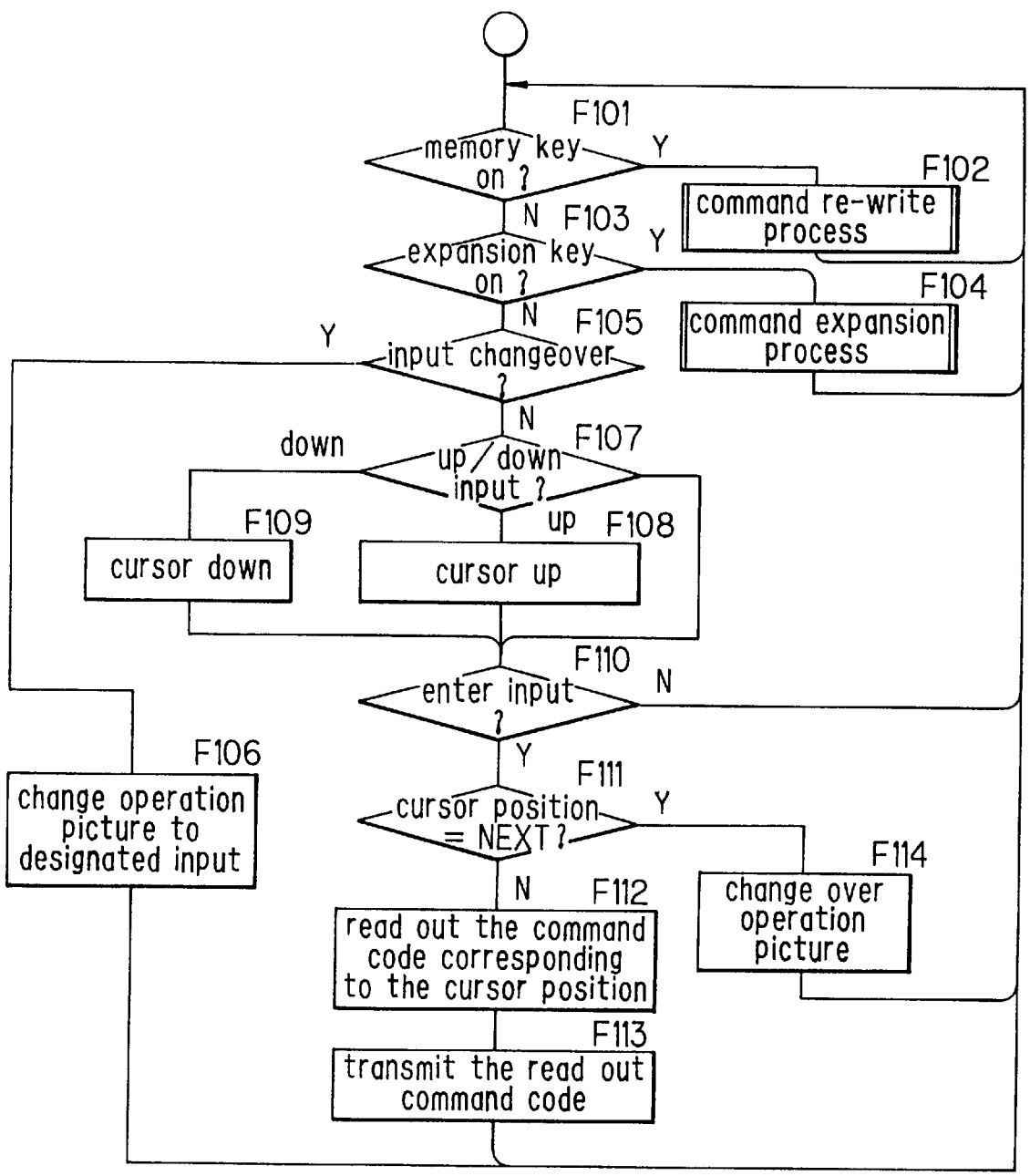
FIG. 3 is a flowchart of the operation process for this remote controller for this first embodiment.

The following is a description of a first embodiment of the present invention.

FIG. 1 and FIGS. 2(*a*)–2(*b*) show the structure of this first embodiment of a remote control system. This embodiment is a remote control system for audio visual equipment and is, for example, constructed from the portion constructed internally within the audio visual selector amplifier for dealing with the position designation input shown in FIG. 1 and the remote controller shown in FIGS. 2(*a*)–2(*b*).

The external perspective view FIG. 2(*a*) and the internal block diagram FIG. 2(*b*) show that there are just three operating keys for the remote controller indicated by the numeral 1, an up operation key indicated by the numeral 2, a down operation key indicated by the numeral 3 and an enter key indicated by the numeral 4.

The numeral 5 indicates the code generator which is constructed from, for example, a microcomputer made up of a CPU and ROM memory. The operation information for the up operation key 2, the down operation key 3 and the enter operation key 4 is then provided by the code generator 5.

The up operation control code, down operation control code and enter control code for the operating keys 2, 3 and 4 are stored in the ROM memory for the code generator 5, any one of which is read out and sent to the transmitter 6 in accordance with the operation information provided. In the transmitter 6, the control code provided then undergoes a predetermined modulation process and is then transmitted as, for example, an infra red light signal or an electromagnetic wave signal. In this embodiment, control codes, for example, were sent from the remote controller 1 using electromagnetic waves.

Also, in FIG. 1, the numeral 10 indicates the audio input selector, which selects which of the audio signals provided by the VTR 1, the VTR 2, the TV tuner and the compact disc player CD connected as external equipment is to be taken as the input audio signal.

The audio signal selected by the audio input selector 10 is then sent to the amplifier 12 via the audio level controller 11, and is amplified 12 by the amplifier before being outputted by a speaker 13 which is housed internally or is externally connected.

Further, the numeral 14 indicates the picture input selector, which selects which of the picture signals provided by the VTR 1, the VTR 2, the TV tuner and the compact disc player connected as external equipment is to be taken as the input picture signal.

The picture signal selected by the picture input selector 14 is then sent to the connected display apparatus via the picture switcher 15, where it is provided to, for example, a CRT to be displayed.

In addition to the kind of selector/amplifier functions described above, there is a position designation input region 20 for dealing with the command codes sent from the remote controller 1 in the form of up, down and enter position designation information.

Numeral 21 indicates the electromagnetic receiver, where command codes transmitted by the remote controller 1 in the form of magnetic waves are received and demodulated and numeral 22 indicates the infra-red light receiver which receives and demodulates command codes sent via infra-red light. In this embodiment, the infra-red light receiver 22 was used during the command code learning operation described hereafter.

The numeral 23 indicates the control area which consists of a microcomputer made up of a CPU 23a, a ROM 23b and a RAM 23c. This control area 23, in addition to controlling the remote control system corresponding to the various operation information for the remote controller provided by the electromagnetic receiver 21, also acts as the control area for the audio visual selector amplifier region. Namely, it also controls in accordance with the operation inputs put in by the user, operations such as the audio input selector 10, the switching of the picture input selector 14, the volume of the audio level controller 11 and the switching of the picture switcher 15.

The numeral 24 indicates the operation section 24 where the various operation keys are arranged, where operation information is sent from the operation section 24 to the control area 23. At the operation area 24, there are function changeover keys (24a, 24b, 24c and 24d) for controlling the switch selection of the audio input selector 10 and the picture input selector 14, a picture changeover key 24e for controlling the switching of the picture switcher 15, a memory key 24f for expanding/re-writing the control, an enter key 14g, and expansion key 24h for entering expansion mode, character keys (24i and 24j), an up operation key 24k and a down operation key 24m.

The numeral 25 indicates a graphic controller which generates predetermined graphic picture signals in accordance with instructions from the control area 23. For example, the picture signal selected at the picture input selector 14 is overlaid onto the output before being sent to the CRT via the picture switcher 15. The display contents of the character picture, as shown in FIGS. 6(a)–6(e), prepares items such as an operation picture SD which displays the operation contents for the various equipment, an indicator such as an arrow to be a position designator (hereinafter this will be the cursor K) for indicating specific operation contents from the operation picture SD and a machine display PD for the part of the operation picture SD being displayed. Now, the cursor K is by no means limited to an arrow, for example, the frame of the selected operation picture could be moved, or or just the operation picture selected could be made to be a different color.

In addition to holding the control data for the audio visual selector/amplifier functions, the ROM 23b and/or the RAM 23c in the control area 23 also store the command codes corresponding to the various electronic equipment connected to audio visual selector/amplifier or external electronic equipment which is completely unconnected. One of these command codes is then designated by the user by the operation of the remote controller 1, this command is then read out and suppled to the infra red light transmitter 26. The command code which was read out is also provided to the terminal 27 before being sent over wire to predetermined external equipment or to an internal circuit system.

The command code provided then undergoes a predetermined modulation process at the infra red light transmitter 26 before being transmitted to external equipment as an infra red light signal. A non-directional infra red output unit can be used, for example, as the infra red light transmitter 26. Naturally, it follows that the various electronic equipment connected to the audio visual selector amplifier should be capable of receiving this infra red signal output by the infra red light transmitter 26.

Also, it would be possible to use a command code transmitter which used electromagnetic waves either in place of or together with the infra red transmitter.

The basic operation of a remote control system having this kind of construction will now be described with the aid of FIG. 3 to FIGS. 6(a)–6(e).

FIG. 3 is a flowchart showing the processes carried out by the control area 23 based on position designation information (up, down, enter) transmitted from the remote controller 1 and the operation section.

The cases for where any one of the memory key 24f, the expansion key 24h or the function change over keys 24a to 24d in the operation section 24 (F101–F102), (F103–F104), (F105–F106) will respectively be described later, but first, the operation during the inputting of the operation information from the remote controller 1 will be described.

Figure 6A:
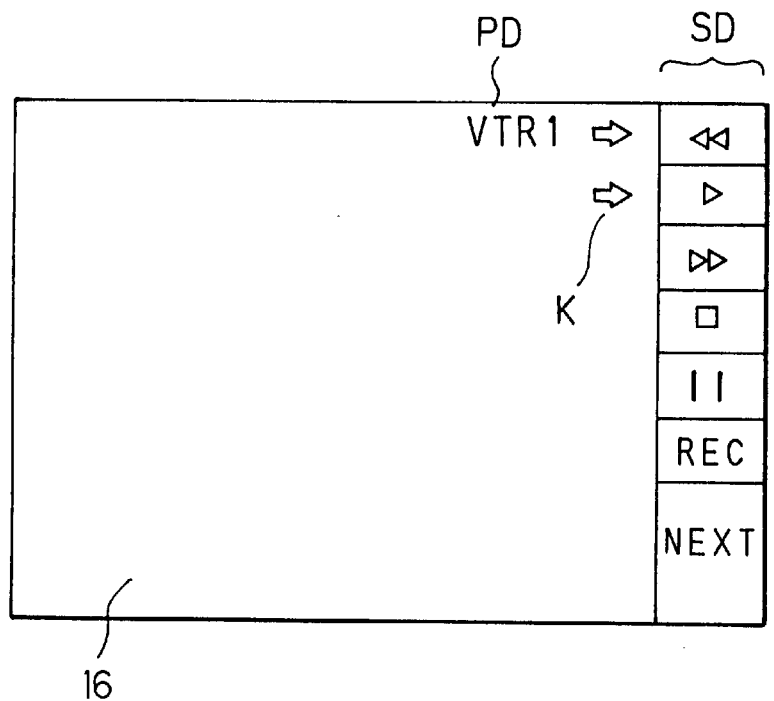
FIGS. 6*a*, 6*b*, 6*c*, 6*d*, and 6*e*, are views describing a picture displayed during the operation of this first embodiment.

Here, for example, the user operates the picture changeover key 24e in the operation section 24. This changes the picture switcher 15 over from terminal Tt to terminal tg, which in turn sends the output of the graphic controller 25 to the CRT 16, and a display such as that in, for example, FIG. 6(a) is shown. Alternatively, if the user presses any of the operating keys 2, 3 or 4 on the remote controller, the transmitted command code is received by the electromagnetic receiver 21 and put into the control area 23. The picture switcher 15 is then automatically changed over by the controller 23 from the terminal Tt to the terminal Tg, the output from the graphic controller 25 is sent to the CRT 16 and the display in FIGS. 6(a)–6(e) is shown.

An operation picture SD is shown on the CRT 16, with this operation picture showing the rewind, play, fast forward, stop and pause operations for VTR 1. Also a picture [NEXT} is displayed for changing over to the next operation picture SD.

The command codes for rewind, play, fast forward, stop and pause operations for VTR 1 are stored in the RAM 23b and/or the RAM 23c in the controller 23.

For the case where the up operation key 2 on the remote controller is pressed and an up command is received and input, the controller 23 shifts the display position of the cursor K from the graphic controller 25 up (F107–F108). For example, in FIG. 6 (a) the cursor K is indicating the [PLAY] operation picture position but the cursor K is then shifted to an operation picture position indicated by the dotted lines [REWIND]. Further, if the pressing of the up operation key is continued, the cursor position will go to [NEXT]-[RECORD]-[PAUSE] and will continue to move in an upward direction.

Also, for the case where the down operation switch 3 on the remote controller 1 is pressed and a down command is received and input, the controller 23 shifts the display position of the cursor K from the graphic controller 25 down (F107–F109). For example, in FIG. 6 (a) the cursor K is indicating the [PLAY] operation picture position so the cursor K is then shifted to the operation picture position [FAST FORWARD]. Further, if the pressing of the up operation key is continued, the cursor position will go to [STOP]-[PAUSE]-[RECORD] and will continue to move in an downward direction.

When the user has shifted the cursor to the desired position using the up command or the down command, the enter key 4 is operated. The enter command is then inputted into the control area 23 and it is determined whether or not the cursor K is currently positioned at [NEXT] (F110–F111). If it is not positioned at [NEXT], the command code corresponding to the operation picture being indicated by the cursor K is read out from the RAM 23b or the RAM 23c (F112).

This is to say that the control area 23 holds the co-ordinate data corresponding to the display regions for each of the operation pictures displayed on the CRT 16. Further, the CPU 23a controls the position conditions of the cursor K when moving it from the co-ordinate position via the up command or the down command. In doing so, by inputting the enter command, it is determined that the position co-ordinates designated by the current position of the cursor K are decided as the operation contents, and the command code held which corresponds to the command code for these position co-ordinates is read out.

Then, if an enter command is input with, for example, the cursor K in the position shown by the solid lines in FIG. 6(a), the CPU 23a reads out the display command code [VTR: PLAY] from the ROM 23b or the RAM 23c, sends it to the infra red light transmitter 26 (F113) from where it is transmitted as a modulated signal in the form of infra red light. This command code put into a transmitted signal is then received by the VTR equipment (not shown in the diagram) which is connected to the audio visual selector amplifier and this VTR equipment is then put into the play operation.

Alternatively, the command code generated from this control area 23 is sent from terminal 27 to either another controller within the audio visual selector or via wire to external apparatus.

If there is an enter command input to the control area 23 while the cursor K indicates the [NEXT] position, the controller 23 will control the changeover of the operation picture which takes place via the graphic controller 25 (F111–F114). For example, in FIG. 6(a) the operation picture for VTR 1 is displayed. However, by entering [NEXT], the picture displayed will be changed to the operation picture SD for the VTR 2, shown in FIG. 6(b), and an operation picture for the rewind, play fast forward, stop, pause and record functions for the VTR 2 is displayed along with a [NEXT] picture. Naturally, the command codes for the rewind, play, fast forward, stop, pause and record functions for the VTR 2 are stored in the ROM 23b or the RAM 23c in the control area 23.

If the cursor is moved to a preferred position in the picture by using the up or down command and then pressing enter, designated command codes will be read out from the control area in the same way for the VTR 2, will be converted to an infra red signal and then be transmitted.

Figure 6B:
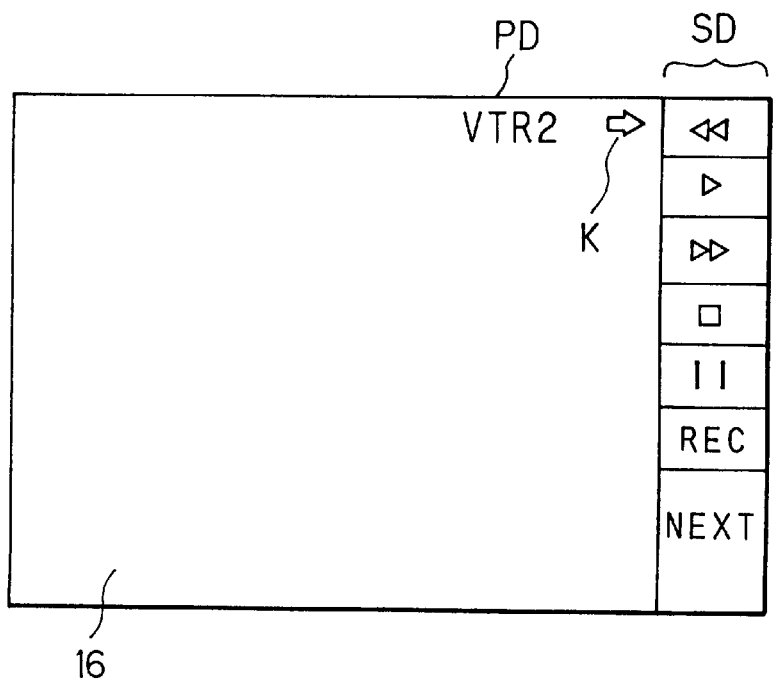
Figure 6C:
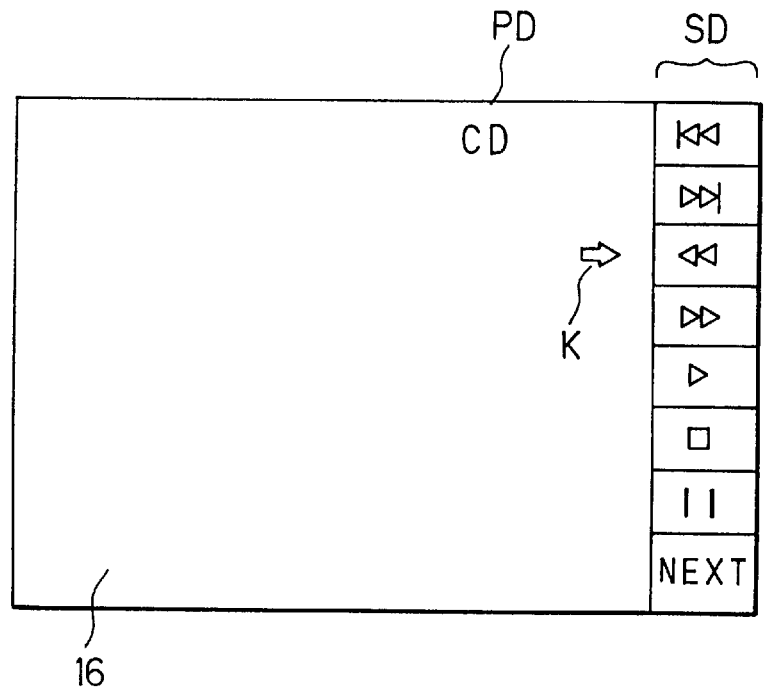

Then, by entering [NEXT], the picture display will be changed over to the operation picture SD for the compact disc player, as in FIG. 6(c), and the operation pictures for the various operations of the laser disc player i.e. go to previous sector, go to next sector, fast forward, rewind, play, high speed rewind, stop and pause, will be displayed along with a [NEXT] picture.

Figure 6D:
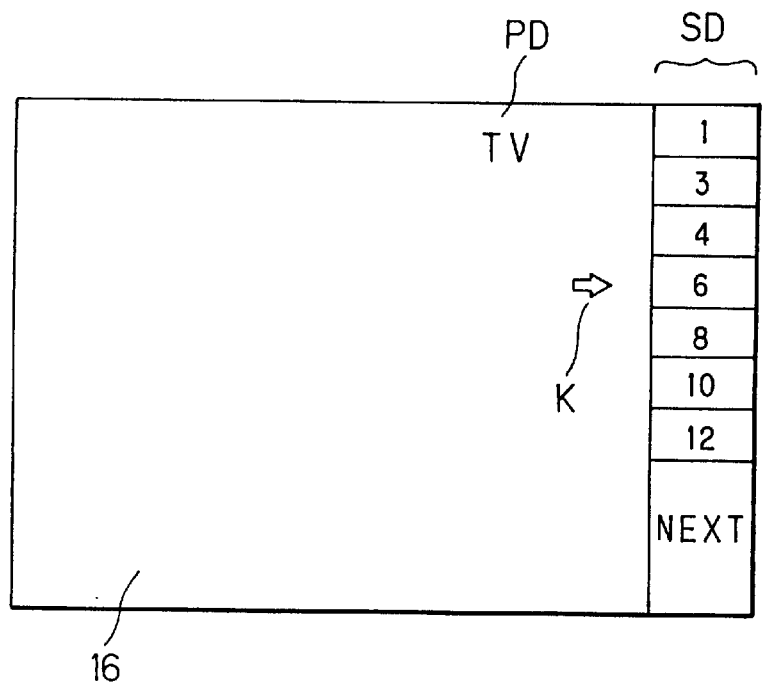

Also, if [NEXT] is entered from the SD for the operation picture SD for the compact disc player, the channel operation picture SD for the television will be selected i.e. FIG. 6(d). Further, by entering [NEXT] again, the operation picture SD for the audio visual selector/amplifier will be selected and a picture will be displayed for the input function changeover operation and the volume up and down operation.

Figure 6E:
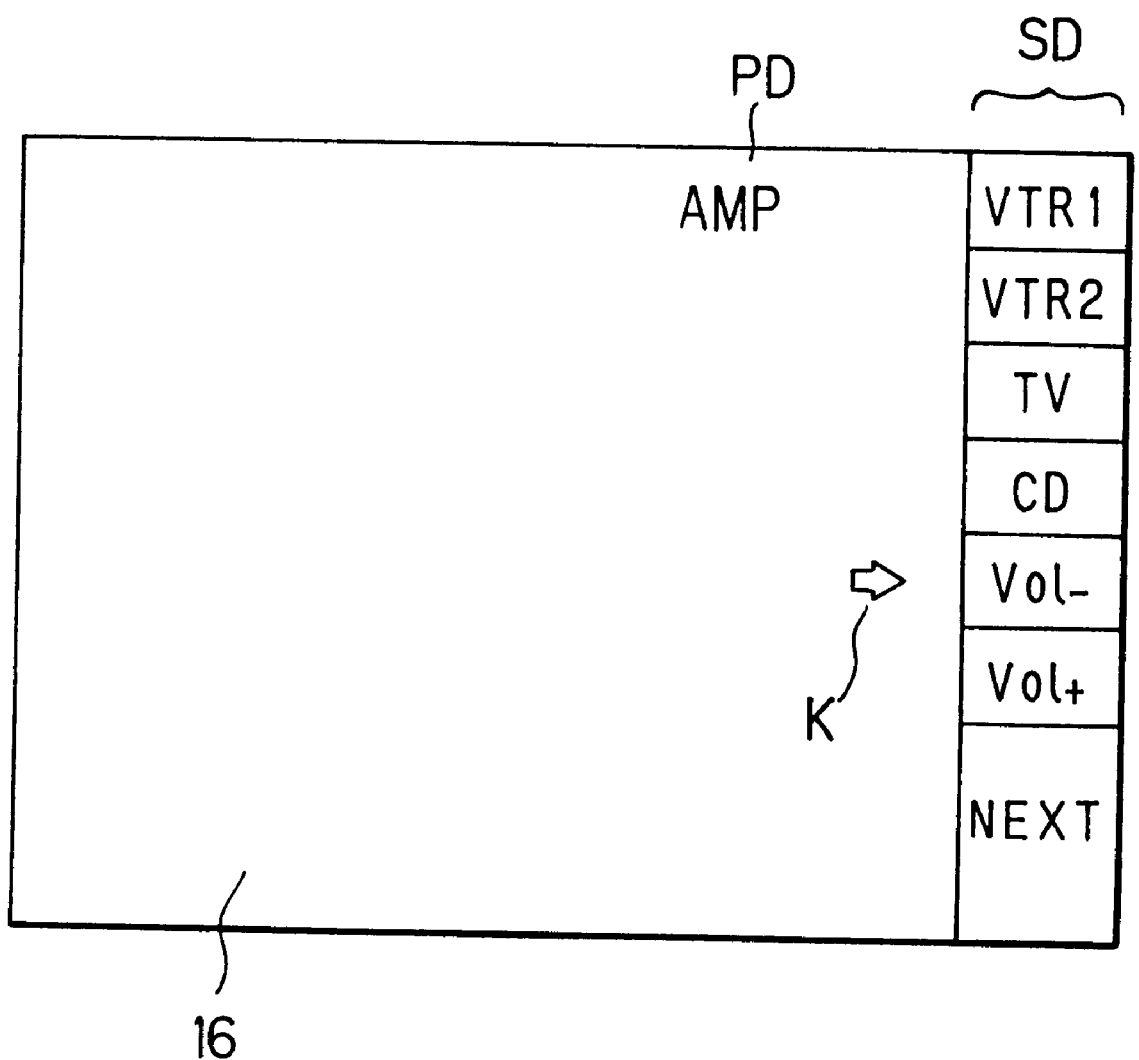

If [NEXT] is then entered again from that in FIG. 6(e), the picture for VTR 1 in FIG. 6(a) will be returned to.

The respective command codes for the various operation pictures in FIGS (a) to (e) corresponding to each item of equipment are stored in RAM 23b or RAM 23c. The command code applicable to the operation contents designated by the cursor in the above mentioned operation is read out, and is then transmitted to external equipment or to an internal controller (F113).

In this embodiment, if an operation in FIG. 6(e) i.e. a function changeover for the audio input selector 10 and the picture input selector or the turning up or down of the volume at the audio level controller 11, is entered, the CPU generates an actual control signal based on the command code which was read out. This is then sent to the audio input selector 10 and the picture input selector 14 or the audio level controller 11. This is so that direct control can be achieved.

Also, in this embodiment, the user can can shift the cursor K by operating the remote controller while looking at the picture on the CRT 16. If the enter key 4 is then pressed at the desired position, various equipment can be operated in such a manner that the operation keys of the remote controller 10 become extremely easy to use.

Particularly, as there are only three operation keys on the remote controller 1, the confusion which occurs when there is a large number of keys no longer occurs. Also, as operations can be carried out while looking at the picture, these operations become less laborious.

Also, as the signal transmitted from the remote controller 1 is in the form of electromagnetic waves, it is possible to carry out operations while retaining the direction from which the remote controller was operated.

Also, if it is tedious to have the operation picture SD displayed when operations are being carried out, when a fixed period of time elapses after the remote controller has been operated or there is no command code input from the remote controller 1, the control area 23 could also automatically change the picture switcher 15 over to the terminal Tt.

Further, other methods such as the superimposition method can be used instead of the operation picture SD and the cursor indication K which make up the so called elemental picture method.

So, in this remote control system, the re-writing of command codes in memory is taken as a learning function. For example, to make the equipment made with different command code formats by different makers compatible, command codes for the new desired functions are stored so that more equipment can become the operation target.

Figure 4:
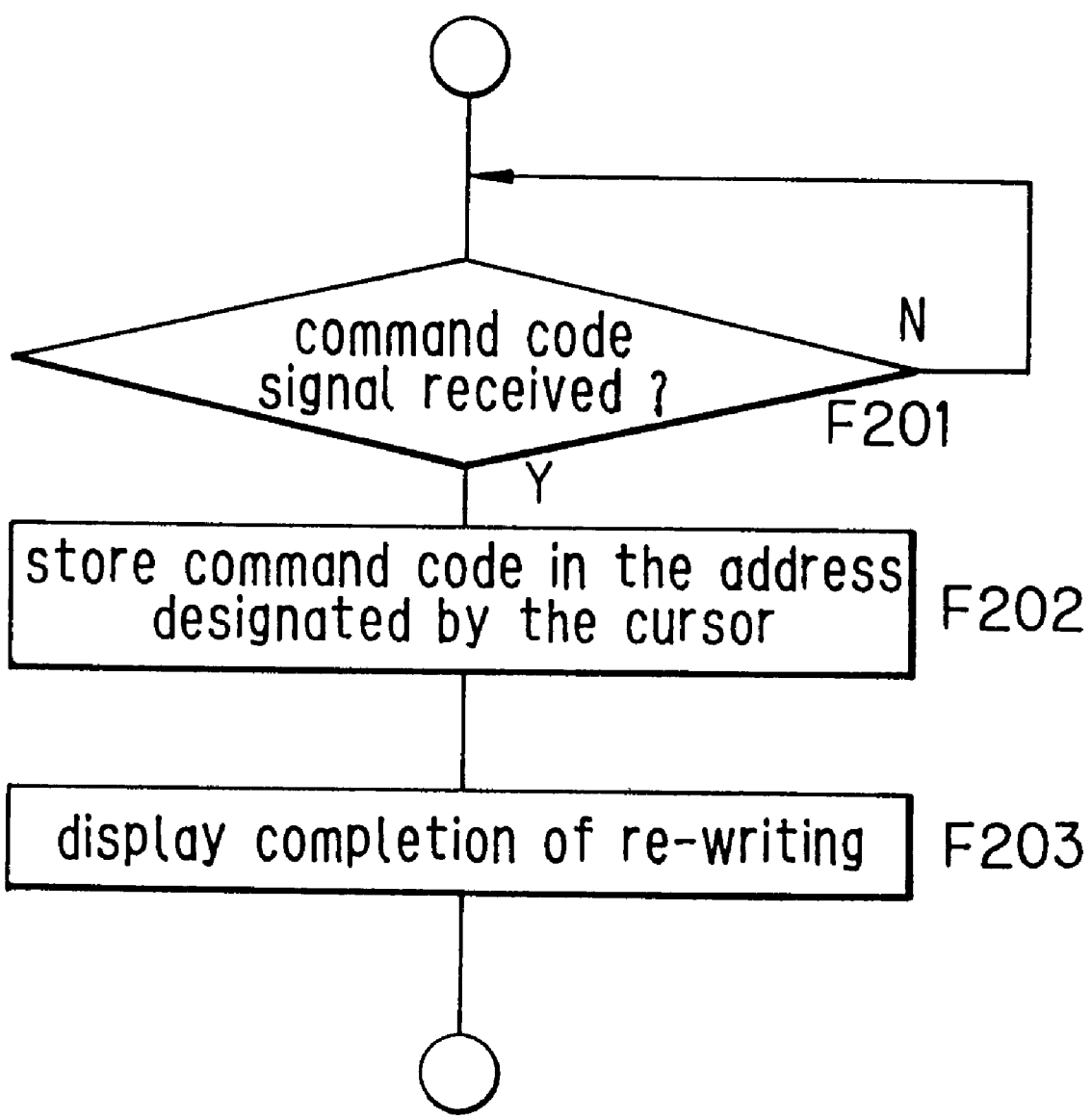
FIG. 4 is a flowchart of the re-write process for the commands occurring in this first embodiment.

In the process flowchart in FIG. 3, while the memory key is being operated, the command re-write process is carried out (F101–F102), and the sub-routine in FIG. 4 is executed.

An example is now given where the user wants to re-write the command code stored for VTR 2 with the command code for a VTR which was adapted for use with a different format command code. First, the user, using the up operation key 2, the down operation key 3 and the enter key 4 occurring in steps F107–F109 of the flowchart in FIG. 3, positions the cursor K at the operation contents in the operation picture which it is desired to re-write, and presses the memory key 24f (F101–F102). For example, rewind is designated, and the memory key 24f is pressed.

The user then uses the remote controller for the equipment which is wished as the operation target to transmit a command code [REWIND] to the infra red light receiver 22.

If the control area 23 receives this [REWIND] command code (F201), the inputted [REWIND] command code is written into the address in the RAM 23c for the position in the operation picture indicated by the cursor K (F202). A re-write completion message is then displayed via, for example, the graphic controller 25, to indicate to the user that the re-write is complete (F203).

Due to the above process, the [REWIND] operation for the VTR being employed by the user which is of a different make now corresponds with the [REWIND] for the VTR 2 in the display conditions shown in FIG. 6(b). So, by entering the [REWIND] shown in the display conditions in FIG. 6(b), the re-written command code is read out of the RAM 23c, and is transmitted to the target VTR equipment.

It follows that with operations such as [PLAY], [FAST FORWARD] and [STOP], by designating a position with the cursor K (F107–109), pressing the memory key 24f (F101–F102) and transmitting these command codes to the infra red light receiver 22 (F201) so that the command code for each operation is re-written (F202, F203), the operations for the remote controller shown in the picture in FIG. 6(b) become the operation picture for the new VTR equipment.

Figure 5:
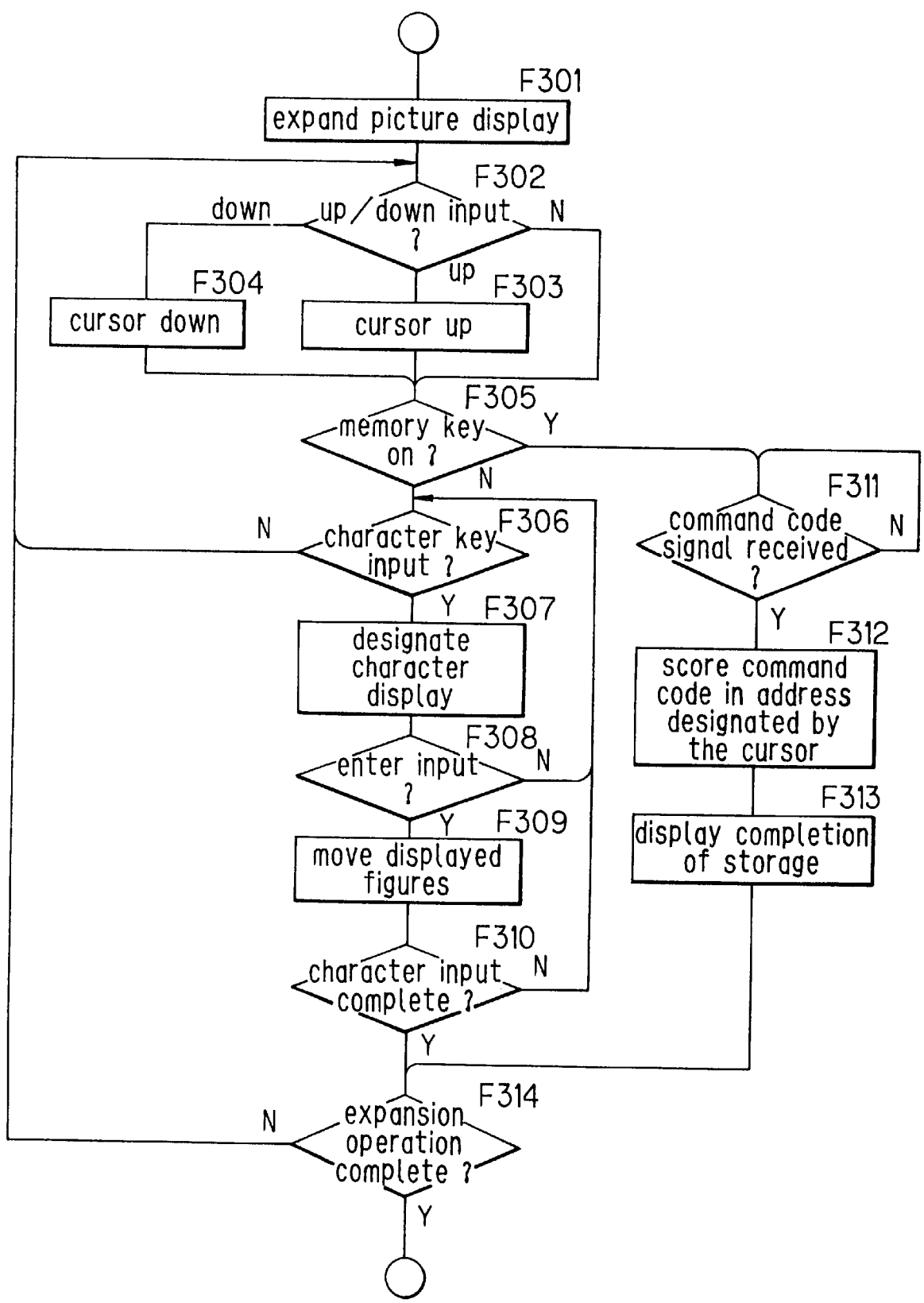
FIG. 5 is a flowchart of the command expansion process occurring in this first embodiment.

Also, in the process flowchart in FIG. 3, the command expansion process is carried out during the operation of the expansion key 24h (F103–F104) and the subroutine process in FIG. 5 is executed.

By operating the expansion key 24, the control area first displays a command expansion picture of the kind shown in FIGS. 7(a)–7(e) via the graphic controller 25 (F301). In other words, this command expansion picture is displayed only on the part of the CRT 16 which does not contain the operation picture.

Here, if the user sends an up or a down command via the remote controller 1, the control area 23 will move the cursor K accordingly (F302, F303, F304). The cursor K can also be moved by operating the up key 24k or the down key 24m.

Figure 7A:
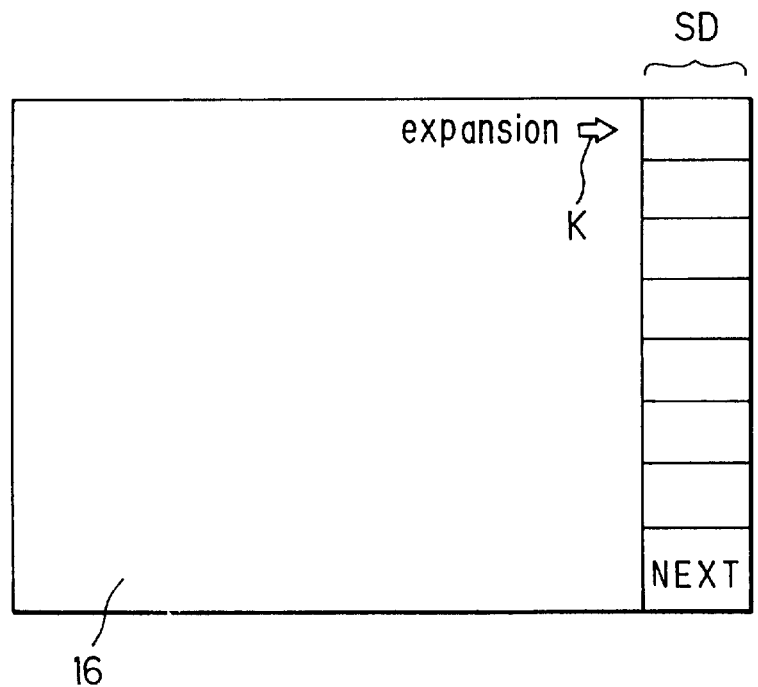
FIGS. 7*a*, 7*b*, 7*c*, 7*d*, and 7*e*, are views describing the picture displayed during the command expansion operation occurring in this first embodiment.

During command expansion, the user can insert characters into the kind of blank windows shown in FIG. 7(a) to show the contents of the command which is wished to be added.

To input the characters, the character+key 24i and the character−key 24j can be used along with the enter key 24. When the character+key 24i and the character−key are pressed, the control area 23 sequentially displays the digits, for example, A, B, C, . . . , Y, Z, a, b, . . . , y, z, 0, 1, 2, . . . , 9, +, −, or Japanese characters inside the window designated by the cursor K via the graphic controller 25 (F306, F307). It is possible to display, for example, 5 characters inside one window.

Figure 7B:
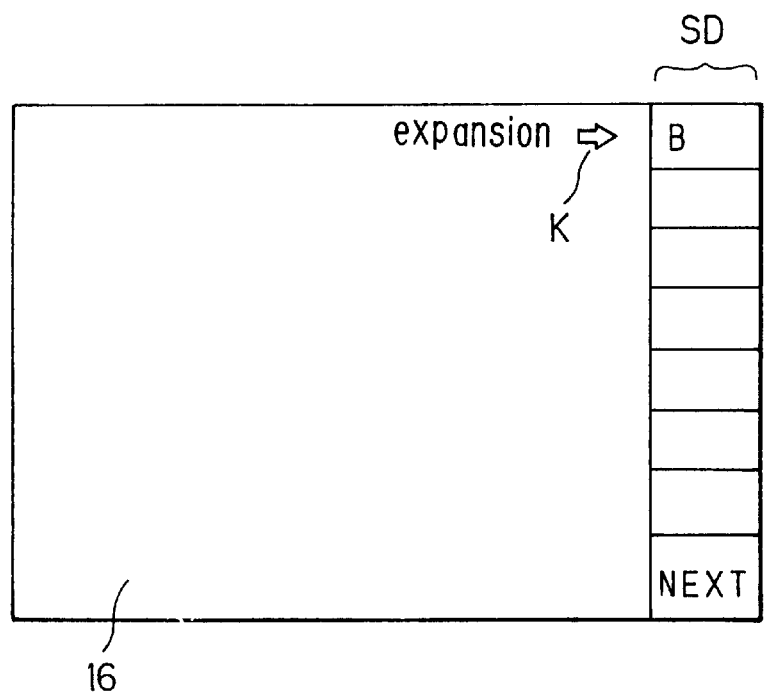
Figure 7C:
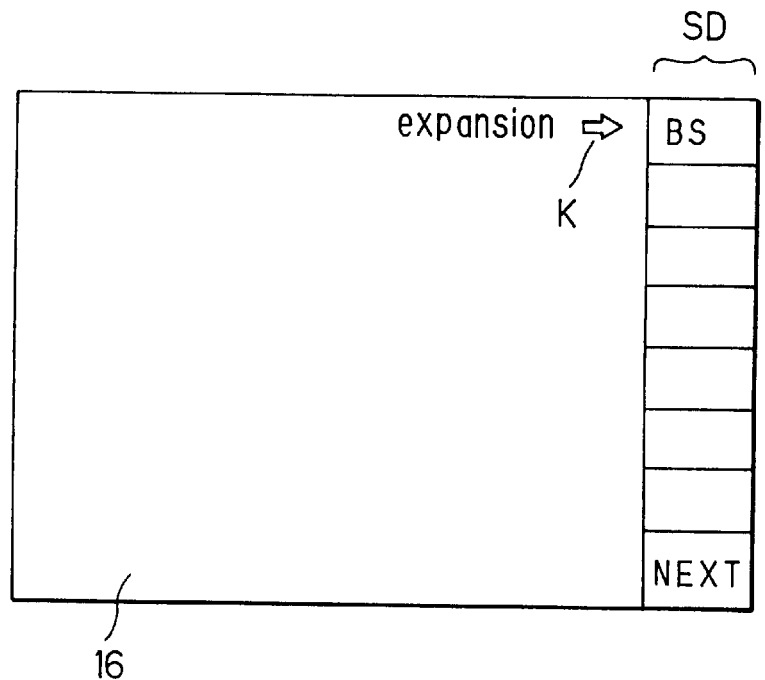
Figure 7D:
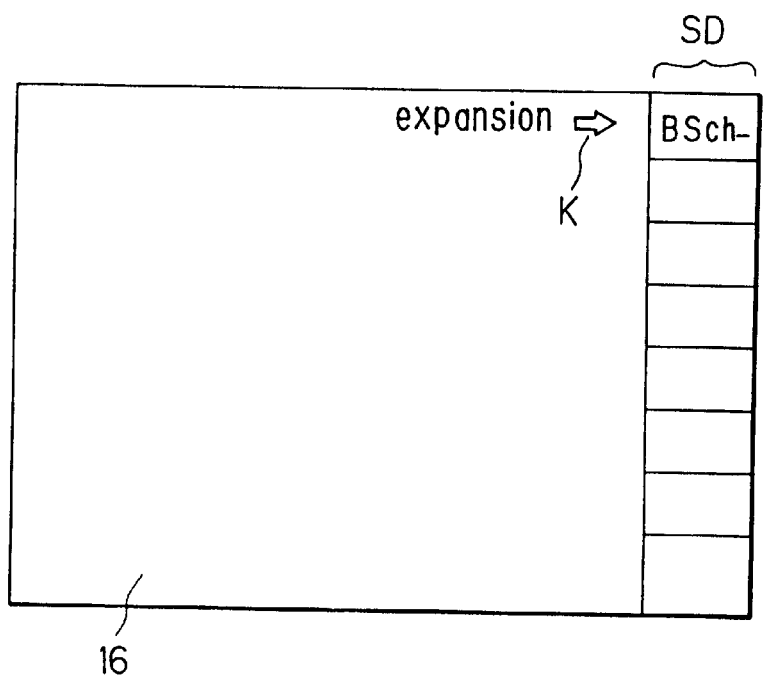

The user then operates the character+key 24i and the character−key 24j so that, for example, as shown in FIG. 7(b), just the character [b] is displayed. The enter key 24g is then pressed so that the first digit [B] is decided (F308). The second display digit is then moved to, and selected in the same way (F309–F306). For example, in FIG. 7(c) a second character [S] was selected. This inputting of characters is then continued in the same way as in, for example, FIG. 7(d) where the characters [BSch−] were input into the blank window.

During the character input operation, the control area determines that the inputting of the 5 characters has been completed when the enter key has been operated five times (F310).

When the user wishes to expand other commands, again, the cursor can be moved to the desired position by operating the remote controller 1, or or by operating the up key 24k or the down key 24m to designate a blank window (F302, F303, F304) and the characters can then be input in the same way (F306–F310). For example, characters such as [BSch−], [BSch+], [light (on)], [air (conditioner)], [SC-UP] and [SC-DW] in FIGS. 7(a)–7(e) can be input.

If the above character input operation is completed, the user can again designate a window using the cursor K and operate the memory key 24f [F305].

Figure 7E:
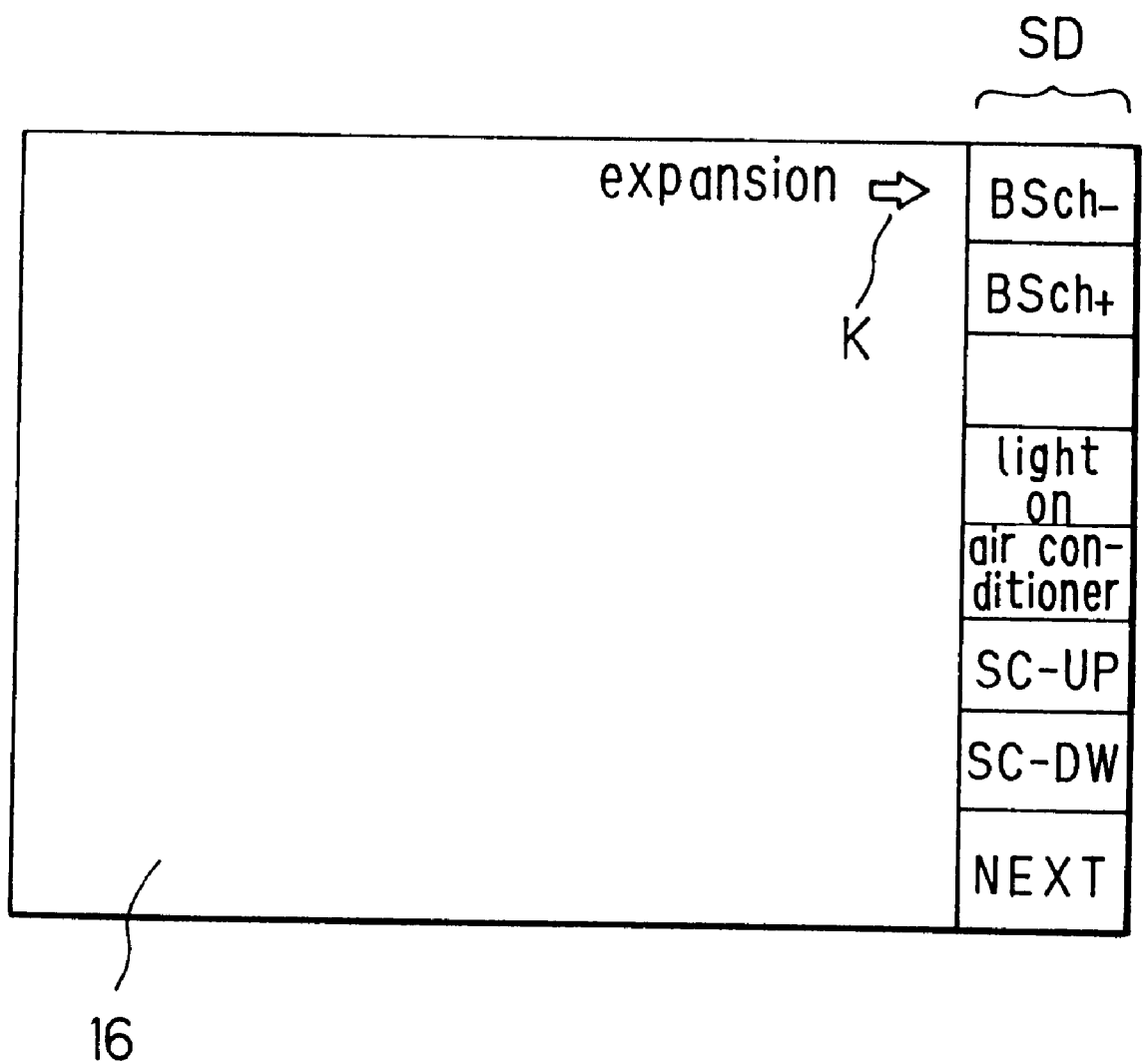

For example, as in FIG. 7(e), by moving the cursor K to the [BSch−] window and pressing the memory key 24f, and then using the remote controller for the Broadcasting Satellite tuner (BS tuner) which is to be made the operation target at this time, a command code [BS channel down] can be sent to the infra red receiver 22.

If the control area 23 receives this command code [BS channel down] (F311), the inputted command code [BS channel down] is written into the address in the RAM 23c corresponding to the position of the operation display indicated by the cursor K (F312). Then, an expansion entry completion message is displayed via, for example, the graphic controller 25, to indicate to the user that the re-write is complete (F313).

It follows that if the cursor is again moved to designate the [BSch+] indication, by using the remote controller for the BS tuner, a command code [BS channel up] can be sent to the infra red light receiver 22. This stores the command code [BS channel up] in a predetermined address in the RAM 23c.

Herein, in the same way, by sequentially designating windows with the cursor into which characters have been inputted and then by inputting the command codes such as: [light on/light off] command codes by using the remote controller for lighting equipment; [air conditioner on/off] command codes by using a remote controller for an air conditioner: and [screen up], [screen down] command codes by using a remote controller for screen equipment, respective expansion commands can be made and stored in the RAM 23c.

If, for example, the expansion key 24h is then pressed again, the expansion process is completed (F314) and the process in FIG. 3 is returned to.

If alter this kind of command expansion is carried out, [NEXT] is entered with the picture display conditions being as those shown in, for example, FIG. 6(e), an expanded operation picture SD like that shown in FIG. 7(e) is output, by designating in the same way with the cursor K and entering, this expanded command code is read out from the RAM 23c, and then transmitted by the infra red light transmitter 25 to equipment arranged around the periphery of the audio selector 10 and the video selector 14 such as, for example, a BS tuner, light equipment or an air-conditioner.

Naturally, the command expansion is limited by the storage capacity of the RAM 23c, and as the expansion commands increase, so the required number of operation pictures to display the expansion commands increases accordingly. These can, however, be increased sequentially. In this case, if, for example, [NEXT] is entered from the operation picture SD for the expansion shown in FIG. 7(e), it has to be considered that another operation picture SD with an expansion will be displayed.

So, in order to keep the character input operation during the command expansion simple, a system where a picture having the form of, for example, an alphabetic or numeric keyboard is displayed during the character input steps and the characters are then designated on the keyboard by using the cursor could also be considered.

Figure 8:
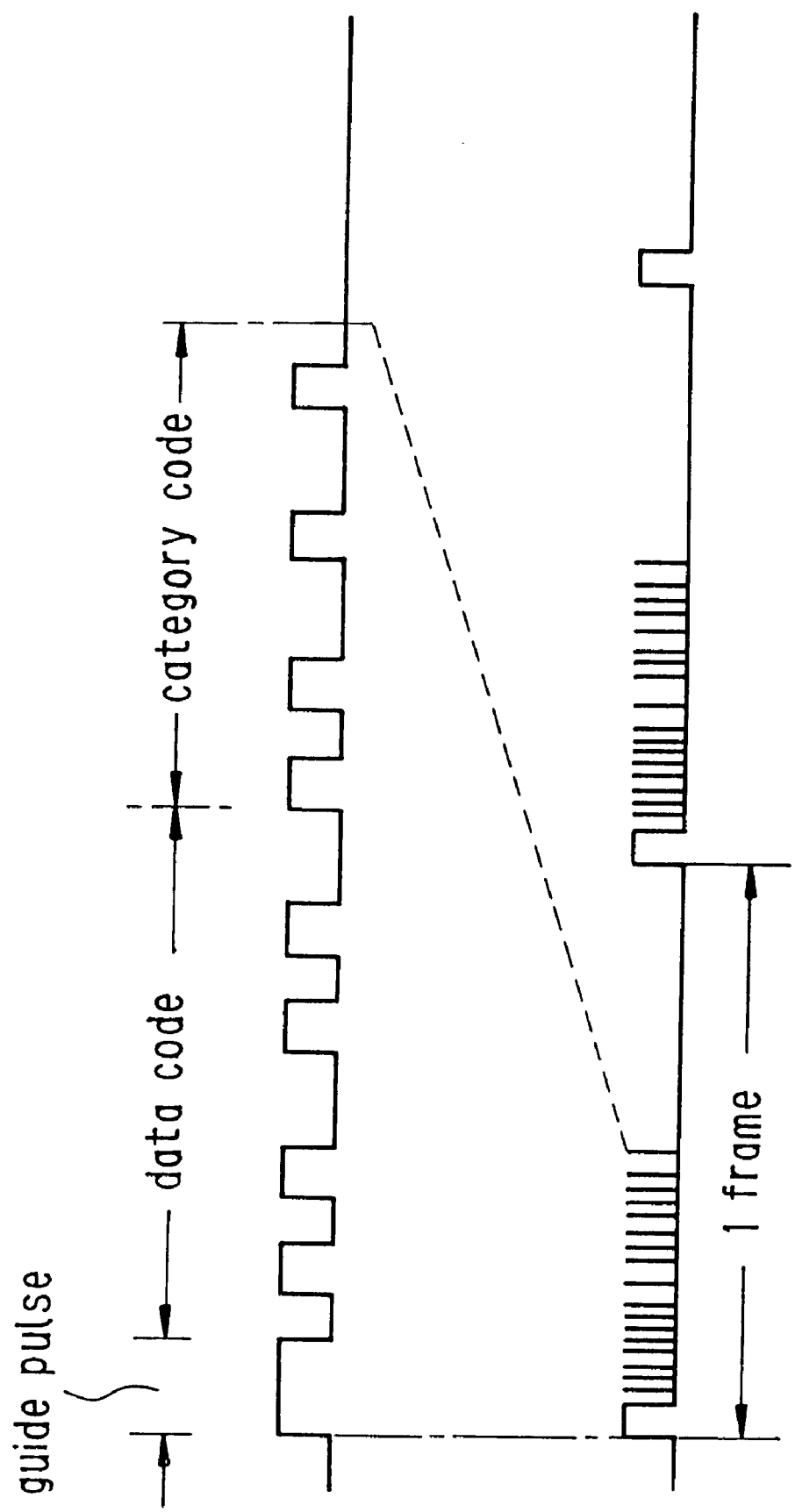
FIG. 8 is a description of the command code.

To carry out operations for a large amount of equipment with various functions a large number of command codes have to be stored in the ROM 23b and the RAM 23c. However, a description will now be given of how the method of storing the command codes in the ROM 23b and the RAM 23c in this embodiment economizes on memory capacity The infra red light command signals sent out by the various remote controllers, an example of which is shown in FIG. 8, are modulated signals which have a data code of a predetermined bit length, a category code of predetermined bit length and a guide pulse. These modulated signals together with the no signal region make up one frame region, which is repeatedly output. Here, the category code holds the equipment code information for for this infra red command signal and the data code holds the code for the actual command information, such as, for example. [PLAY] or [STOP].

A suitable process for a storage method for this command code is shown in FIGS. 9 to 12.

Figure 9:
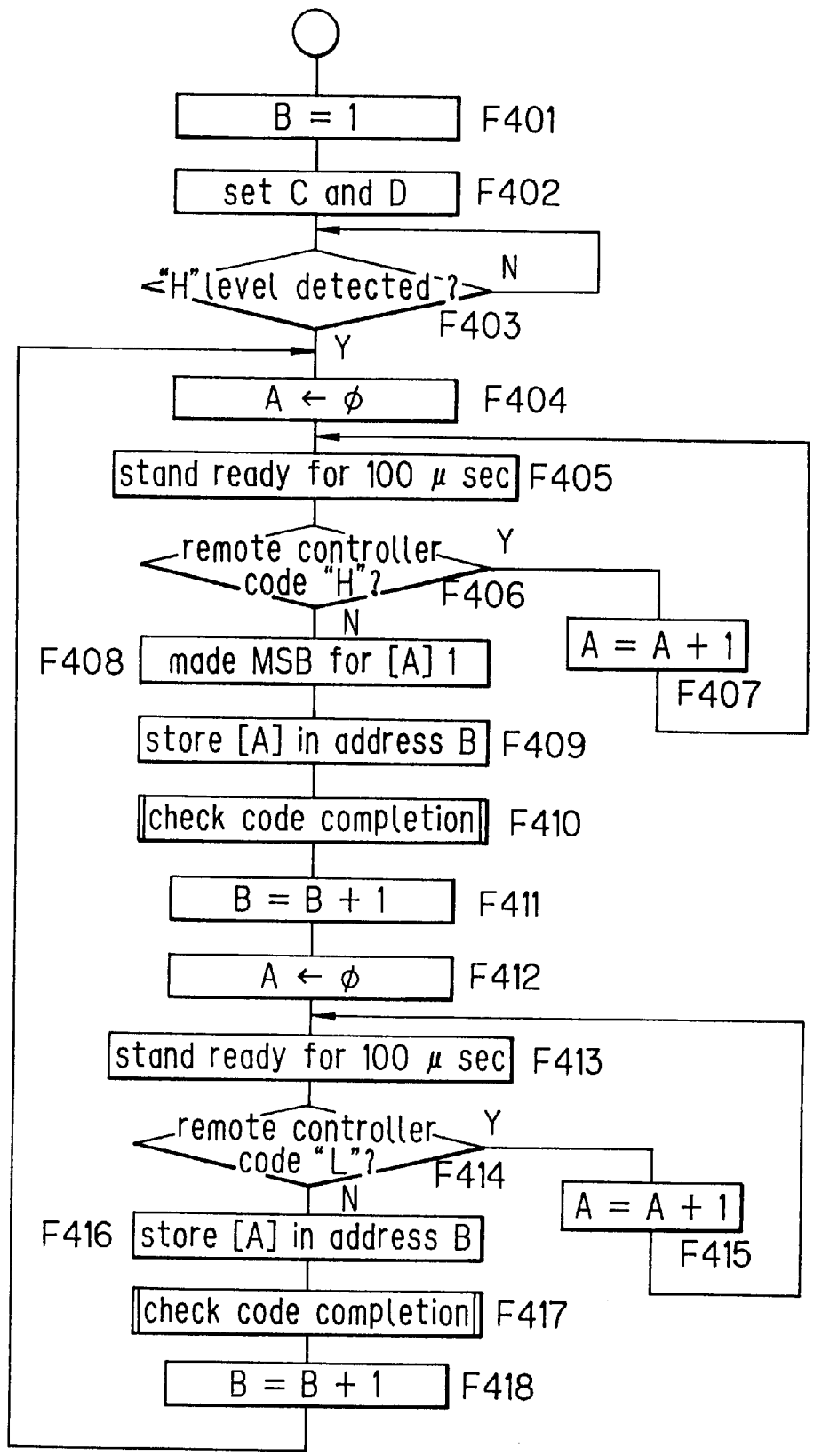
FIG. 9 is a flowchart of the command code storage operation for this embodiment.
Figure 11:
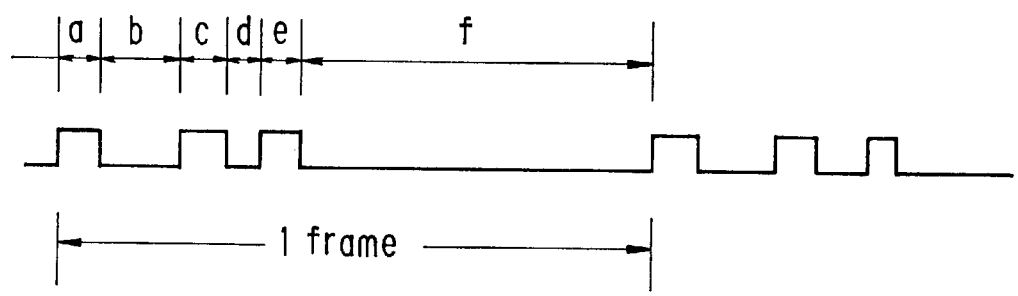
FIG. 11 is a description of the command code storage operation for this embodiment.

The flowchart in FIG. 9 is a detailed description of the process which occurs in step F202 in FIG. 4 and step F312 in FIG. 5. This storage method economizes on the storage capacity required by obtaining a numerical value for the command signal pulse length. As can be seen from FIG. 8, this infra red command signal is made up of high and low pulses. However, if these high periods and low periods (a–f) occurring within one frame as can be seen in the pattern in FIG. 11 are viewed as time period lengths (count values), the count values for each period (a–f) can be sequentially stored in each address, as shown in FIG. 12.

While the control area 23 is storing the command code, the storage address B for the RAM 23c is first made to be [1] (namely, [0001] in FIG. 12) (F401). At this time, the address B corresponds to the front header address within the address region for the position indication of the cursor K. Next, the variables C and D are set (F402).

The user outputs the command code required to the infra red receiver 22. The control area 23 then picks this out and executes the following process. First, if a high is detected in the command signal (F403), after the variable A has been cleared to zero (F404), the process enters a wait state for, for example, 100 micro seconds (F405). It is then determined whether the command signal is still high or not (F406). If it is still high, the variable A is incremented (F407), and after a wait state has again been entered for 100 micro seconds it is again determined whether or not the command signal is still high. Also, the number of times the process enters the wait state at this point is counted. For example, if a pulse length of 1 milli second such as the one shown in FIG. 11 is encountered, the count will be A=10.

This count is stopped when a low level signal is detected in step 406. Then, the MSB (most significant bit) of the variable A is made to be [1], and the count value for this variable A which had its most significant, bit made to be [1] is then stored in address B (F408, F409).

For example, for the case where the count for A is 10, i.e. the case where the eight bit data is A=[00001010], the number [00001010] from step F408 must undergo an OR operation together with the number [10000000] to make the MSB [1]. The result [10001010] is then stored in address B (B=[0001]) as shown in FIG. 12. The item which had its most, significant bit made to [1] now describes the period for which there was a high level.

Next, a check (F410) to see if one frame of the command signal has finished is then made in the way described by the subroutine in FIG. 10 (to be described later). If it is not finished, the address B is incremented (B=[0010]) (F411), and the variable A is cleared to A=0 (F412).

Then, in steps F413, F414 and F415, the period b for which the command signal becomes low is detected. So, the variable A is incremented every 100 micro seconds for which the command signal level is low. It follows that if the period b is 2 milli seconds, the count A will be 20.

This count is ended when a high level is detected in step F414. After this, the count value for the variable A is stored in address B (F416). For example, in the case where the count for A is 20, i.e the case where the eight bit data A=[00010100], this data is stored in address B (B=[0010]) as is shown in FIG. 8. The MSB is not set to [1] in the case a low level signal.

Next, a check (F417) to see if one frame of the command signal has finished is then made in the way described by the subroutine in FIG. 10 (to be described later). If it is not finished, the address B is incremented (F418), the step 404 is again returned to and the period of the high level signal (the period c) is detected. By using the loop in steps F404 to F418 to, detect the length of the highs and lows in the command signal and then putting this information into code, drastic economies can be made in the storage capacity when this method is compared to the method where information concerning the highs and lows is stored periodically on a simple predetermined sample timing.

Figure 10:
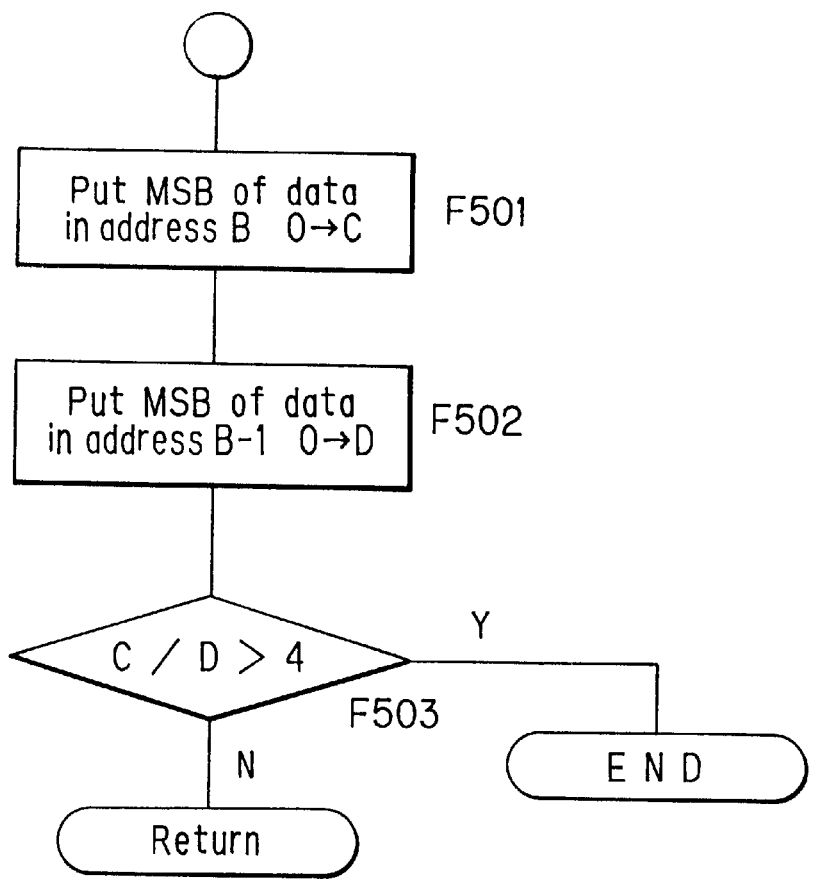
FIG. 10 is a further flowchart of the command code storage operation for this embodiment.

The routine for carrying out the check to see if one frame has finished, which occurs in step F410 and step F417, is shown in FIG. 10. Firstly, with regards to the data most recently put into the address B, the seven bits of data from the second most significant bit down are taken as target (i.e. the MSB is made to be zero), and this is taken as the data C (F501). Also, the most significant bit of the data stored in the address one address before the address B (B-1) is made to be [0], and this is made to be the data D (F502).

The calculation (C/D) is then carried out. For example, if (C/D) is greater than four, then one frame has been completed and the routine in FIG. 9 is finished. If (C/D) is less than or equal to four, then one frame has not yet been completed and the routine in FIG. 9 is returned to (F503).

This is to say that this check operation is to detect the second half of the frame where the signal is flat (i.e. there is no signal). According to the routine in FIG. 9, the time period (count value) corresponding to the period f in FIG. 11 is much longer than the time (count value) for the period e. Therefore, a predetermined number is decided while giving careful consideration to the command signal format, and if the current count value is a number of times larger than the previous count value where this number of times is equal to this predetermined number, (for example, four times), then it is determined that one frame has finished and the storage operation is ended.

After the command codes stored in the ROM 23b and the RAM 23c are read out by the CPU 23a, they are converted to the usual kind of signals of the kind shown in FIG. 11, and are transmitted from the infra red light transmitter 26 or the terminal 27.

So, in this "display method", operation pictures are displayed on the CRT 16 for the connected equipment, and by entering [NEXT] the display is changed over to an operation picture for another item of equipment. In this way, an operation picture can be shown without having to make a dedicated space on the screen for these operation pictures. Also, this can be achieved while causing little hindrance to the original picture provided by the picture input selector 14. However, switching over to the operation picture for the corresponding equipment while operating can be troublesome.

Here, for the case in this embodiment where an audio visual selector is the functioning portion, an input function which can be successively changed over and an operation picture, the display of which can also be switched over, is preferable.

For example, in a first method, the input key 24a for the VTR 1 forms the function of changeover keys 24a to 24d when the operation section 24 is operated, so that VTR 1 is selected as the picture and audio source, and the first operation picture to be displayed will be that shown in FIG. 6(a). In the same way, if the input key 24c is operated so that the TV tuner is selected as the audio and video source, the first operation picture SD to be displayed will be as that shown in FIG. 6(c).

Troubles encountered when changing over the operation picture SD can therefore be alleviated by this kind of process.

Next, a second method to provide greater ease of operation is described with reference to FIG. 13 and FIG. 14.

Figure 14A:
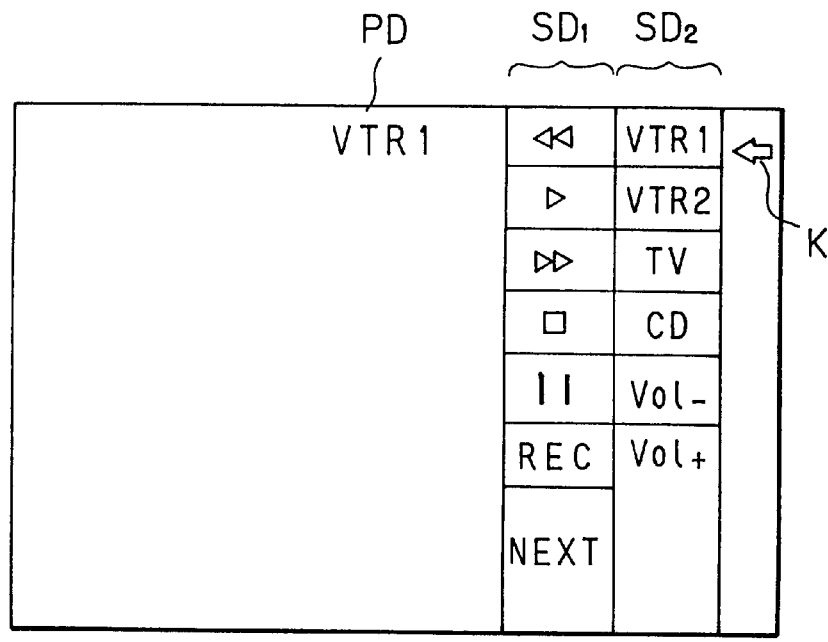
FIGS. 14*a*, 14*b*, and 14*c*, are description of the picture displayed during the operation of an example application of this first embodiment.
Figure 14B:
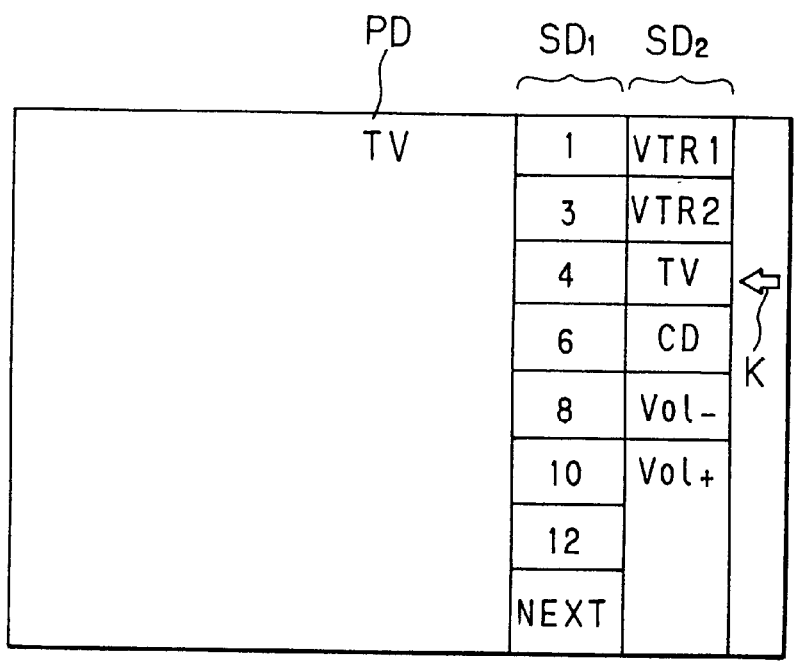
Figure 14C:
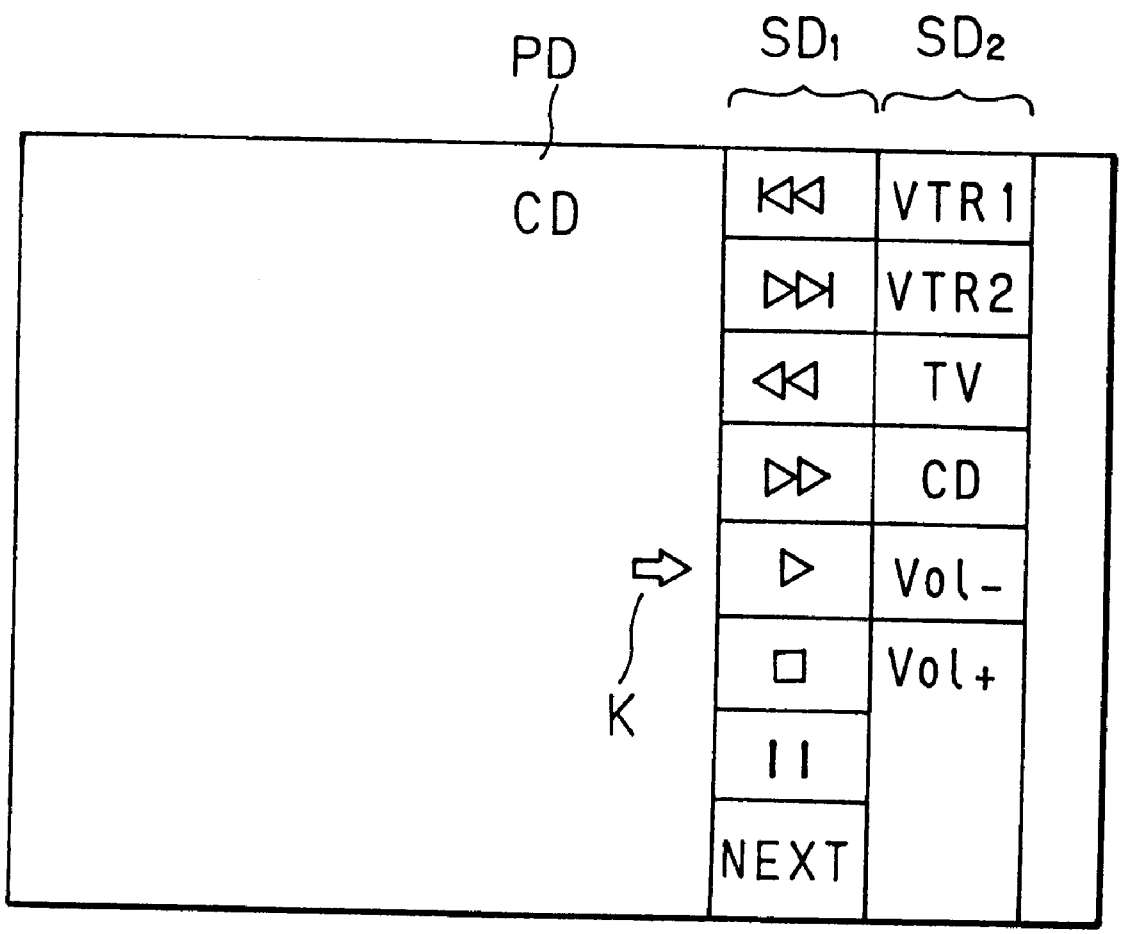

In this case, as is shown in FIGS. 14(a)–14(c), the controller 23 displays an operation picture SD1 for each item of equipment and an operation picture SD2 corresponding to the function changeover operation for the audio visual selector amplifier and the volume operation at the same time via the graphic controller 25.

Figure 13:
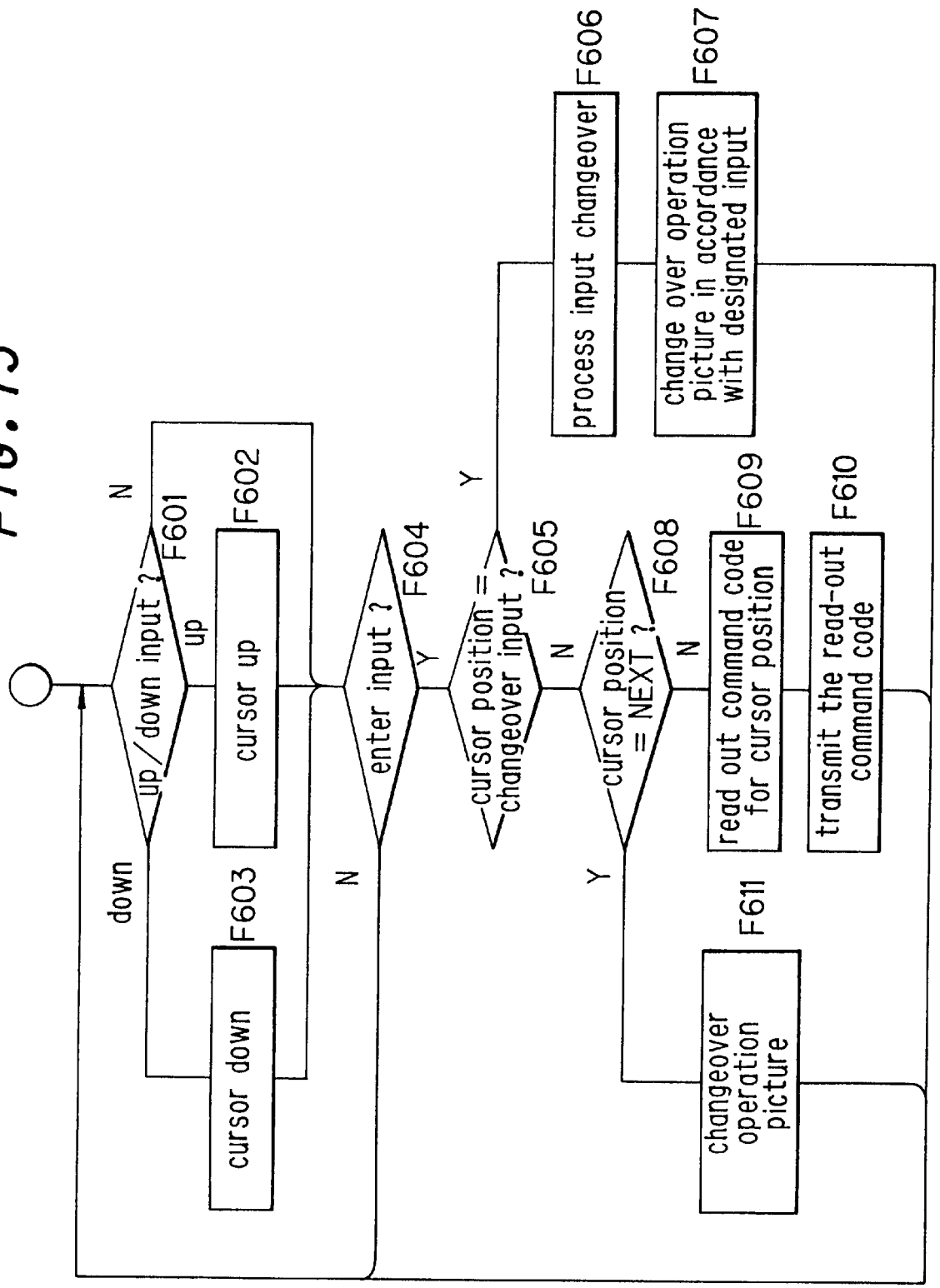
FIG. 13 is a flowchart of the remote control operation process for an example modification of this first embodiment.

The control area carries out the process shown in FIG. 13 in accordance with the operation of the remote controller 1 for this case.

If Up or down inputs are sent from the remote controller 1 the cursor K will be shifted in the same way as the previous case in FIG. 3 (F601, F602 and F603).

This up and down process is carried out, for example, sequentially through the display picture SD1 and then SD2 i.e. If a down command is input from the [NEXT] position, the cursor will go to the [VTR 1] position.

If an enter command is inputted from the remote controller 1 (F604), it is determined whether or not the current cursor position designates a display picture for the input changeover function i.e. one of [VTR 1], [VTR 2], [TV] or [CD] in the display picture SD2. If it is determined that one of these is designated, the process proceeds to step F606. In response to this enter operation, the switch over is carried out (F606) for the audio input selector 10 and the picture input selector 14 so that the indicated input source is selected. The process then changes back to the operation picture SD1.

For, example, if [TV] is entered, an operation picture corresponding to a TV tuner is changed over to for the operation picture SD1, as is shown in FIG. 14(b). Also, if [CD] is entered, an operation picture corresponding to a CD is changed over to for the operation picture SD1, as is shown in FIG. 14(c).

In the case where an operation picture other than an input function changeover is entered, as in the case in FIG. 3, a command code designated by the cursor K is generated and then transmitted (F609, F610). The operation pictures can then be sequentially ran through by repeatedly entering [NEXT] (F608–F611).

By employing the above process, the user can automatically prepare the operation picture for the equipment which is most likely to be used (i.e. the selected equipment) to be at the top of the picture. This greatly reduces the number of times which the remote controller in question has to be operated in order to operate the object equipment and greatly increases the ease with which the system can be used.

So now, even when the remote control system is not together with the audio visual selector, if a way of inputting the changeover information for the audio visual selector is arranged, it is possible to carry out control as if it were.

Next, a second embodiment of the remote control system in this invention will be described with respect to FIGS. 15 to 19.

Figure 15:
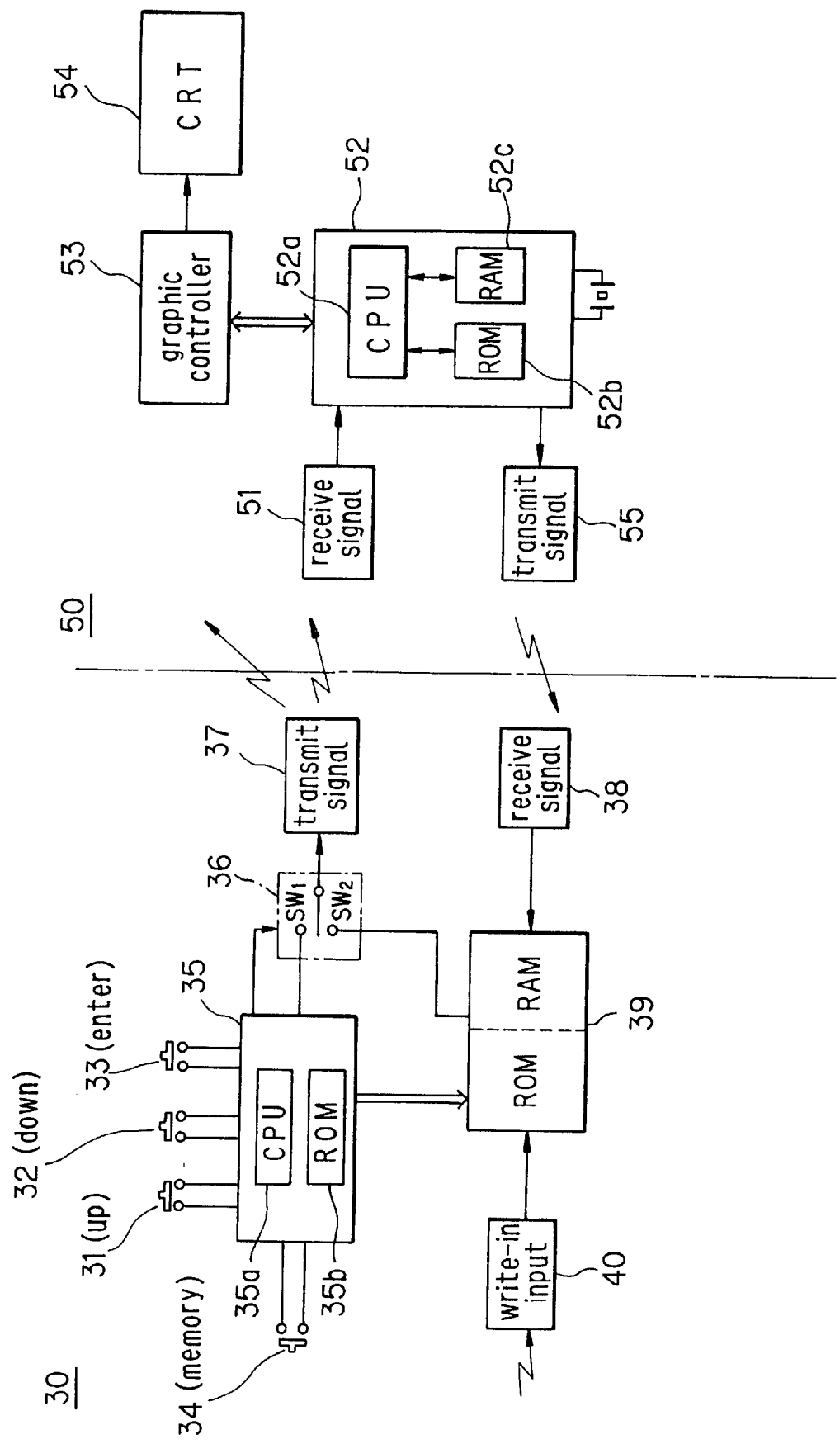
FIG. 15 is a view describing the structure of a second embodiment of this invention.

FIG. 15 is a block diagram of the remote control system for this embodiment, which is constructed from a remote controller 30 and a position designation input area 50.

With respect to the remote controller 30, the numeral 31 indicates the up operation key, numeral 32 indicates the down operation key and numeral 33 indicates the enter key. The numeral 34 indicates the memory key which is used during the learning process described below.

The numeral 35 indicates the controller/generator which generates the commands for the functions of the up operation key 31, the down operation key 32 and the enter key 33 together with being the controller for the memory area 39. It is formed from a microcomputer consisting of a CPU 35a and a ROM 35b for storing the up commands, down commands and enter commands.

The numeral 36 indicates the output selector, which is changed over between the terminal SW1 and the terminal SW2 by the controller 35.

The numeral 37 indicates the transmitter 37 which puts the command code provided via the output selector 36 and puts it through a predetermined modulation process, before outputting it in the form of and an infra red signal.

The numeral 38 indicates the infra red light receiver, which receives the position designation code transmitted from the position designation input area 50 and sends it to the memory area 39. The memory area 39 is made up of a ROM and a RAM where the command codes for carrying out the various operations for each of the various items of equipment are stored. Also, the numeral 40 indicates the write in input which receives command codes to be written in with the learning function to be described later.

On the other side, the position designation input area can be, for example, internally constructed within the audio visual selector amplifier in the same way as that described in the first embodiment or can be put in a separate unit.

The numeral 51 indicates the infra red light receiver which receives the command codes transmitted from the remote controller 30 and the numeral 52 indicates the control unit which is made up of a microcomputer having a CPU 52a, a ROM 52b and a RAM 52c. Also, the numeral 53 indicates the graphic controller and the numeral 54 indicates the CRT which can be put within the actual unit or can be connected to it. The operation pictures are then displayed by outputting characters from the graphic controller 53.

Designation codes corresponding to the positions of the operation pictures displayed on the CRT 54 are stored in the ROM 52b and the RAM 52c which are in the controller 52. If an operation picture is then designated by the cursor K, the designation code corresponding to this is read out and sent to the infra red light transmitter 55. The designation code is then put through a predetermined modulation process at the infra red transmitter 55 before being sent to the remote controller 30 as an infra red signal.

Figure 16:
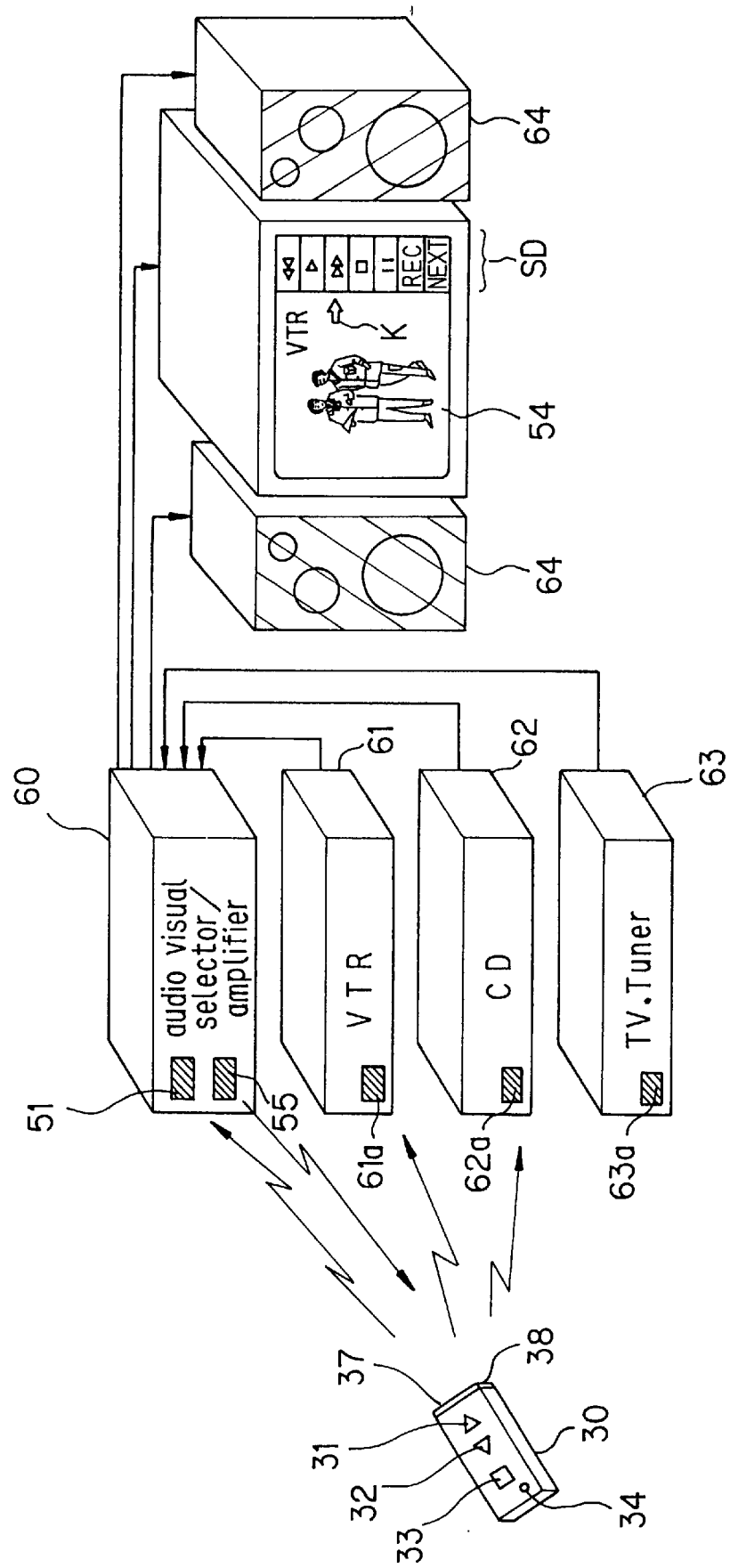
FIG. 16 is a view describing an exemplary structure of an audio visual system for this second embodiment.
Figure 17:
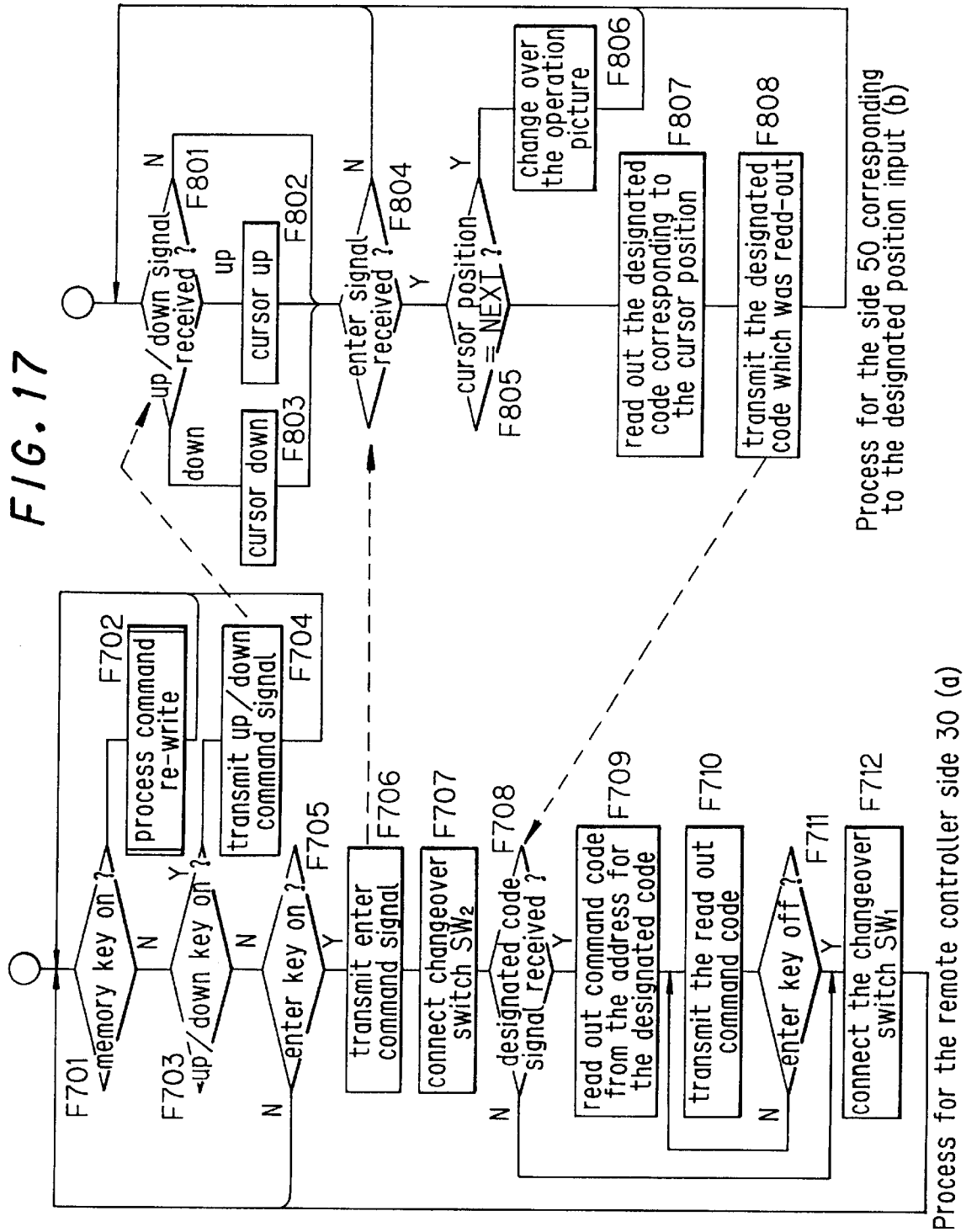
FIG. 17 is a flowchart of a remote control operation process for this second embodiment.
Figure 18:
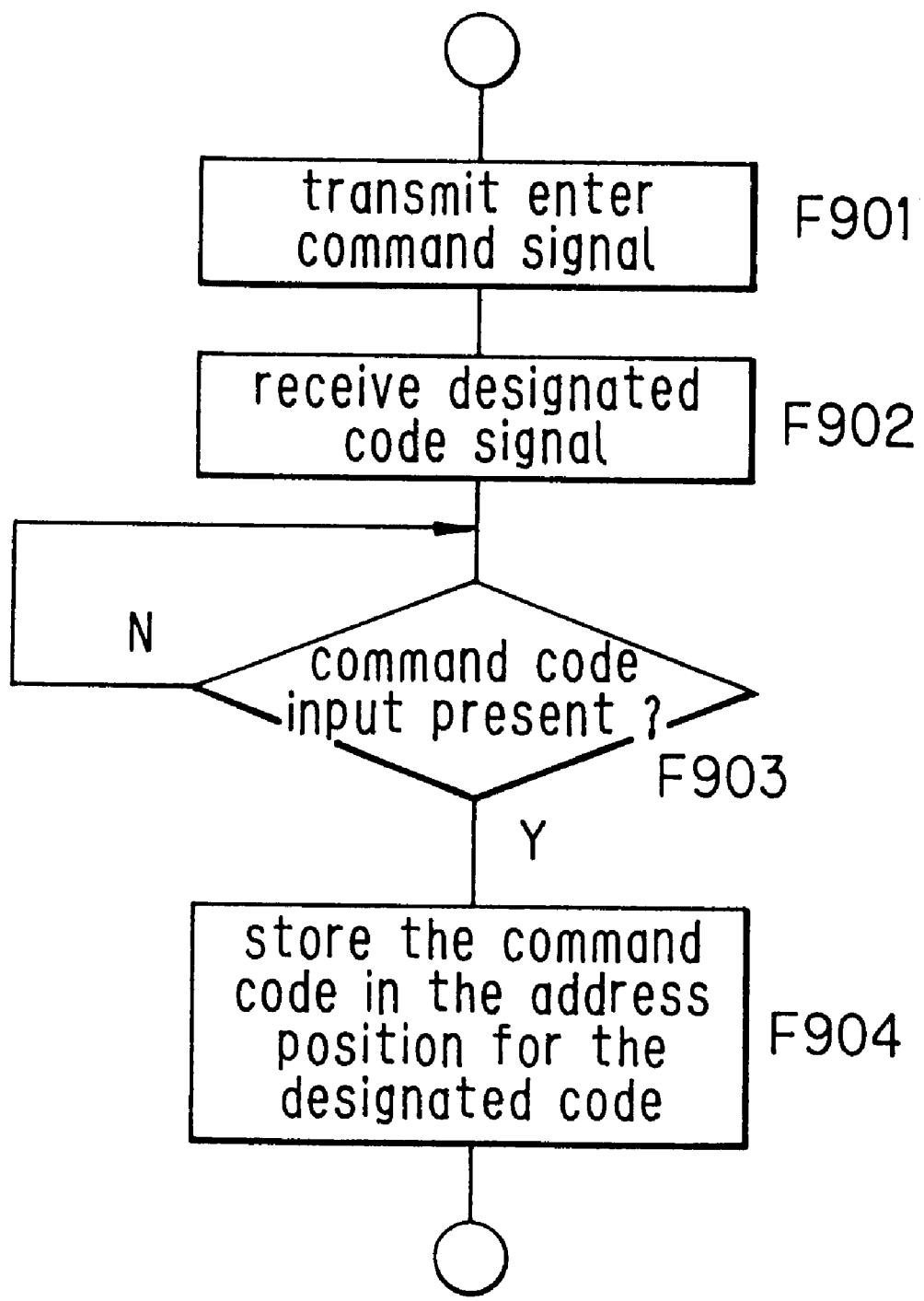
FIG. 18 is a flowchart of the command re-write process occurring in this second embodiment.
Figure 20:
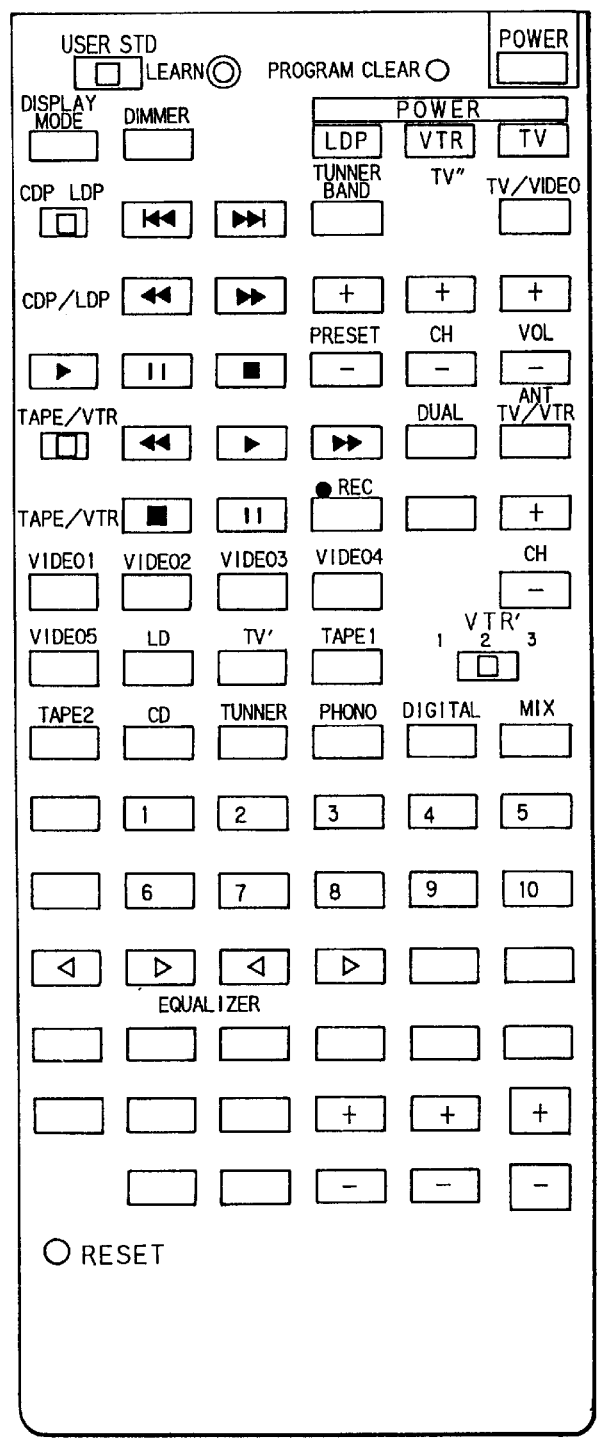
FIG. 20 is a view describing a conventional remote controller.

An example of the structure of an audio visual system where the position designation input area 50 is constructed internally within an audio visual selector amplifier 60 is shown in FIG. 16. Here, the numeral 61 indicates a VTR, numeral 62 indicates a compact disc player, numeral 63 indicates a TV tuner and numeral 64 indicates a speaker.

In this remote control system, the controller/generator 35 for the remote controller 30 executes the process shown in FIG. 17(a) and the controller 52 for the position designation input area 50 executes the process shown in FIG. 17(b). In this way, rather than just being able to control the audio visual selector/amplifier, the remote controller 30 can control the items connected to it such as the VTR 61, the compact disc player 62 and the TV tuner 63. Also, in the same way as the previous embodiment. With this embodiment, it is also possible to control electronic equipment which has no connection with the audio visual system but which is arranged at its periphery (for example, air conditioners and lighting equipment).

If the up operation key 31 or the down operation key 32 on the remote controller 30 is pressed, the controller/generator 35 reads an up command or a down command from the ROM 35b, and is provided to the infra red transmitter via the output selector 36 which is connected to the terminal SW1. It is then transmitted via the infra red transmitter 51 for the position designation input area 50.

The controller 52 in the position designation input area 50 controls the graphic controller 53 in accordance with the inputted up or down commands so as to shift the cursor K about the operation picture SD displayed on the CRT 54 (F801, F802 and F803).

After the user has operated the remote controller to move the cursor about the picture to the desired position, by operating the enter key 33 the operation contents can be designated in the same way as described for the previous embodiment.

The enter command is read out from the ROM 35b and is sent to the infra red light transmitter 37 via the output selector 36 to be transmitted to the infra red light receiver 51 (F705, F706). Here, after the controller/generator 35 has transmitted the enter command, the output selector 36 is switched over to terminal SW2 (F707).

The controller 52 which inputted the enter command (F804) then determines the current position of the cursor K, and confirms which operation picture it corresponds to. If the cursor designates [NEXT], the operation picture SD is changed over to the designated one via the graphic controller 53 (F805–F806).

If the cursor does not designate [NEXT], the designation code corresponding to the designated operation picture is read from the ROM 52b or the RAM 52c (F807) and then sent to the infra red light transmitter 55 from where it is transmitted.

The position designation code transmitted from the infra red light transmitter 55 is then received and demodulated by the infra red light receiver 38 before being sent to the memory area 39.

Here, in this embodiment, the designation code held by the controller 52 in the position designation area 50 is given an address code corresponding to the memory area 39 in the remote controller 30.

As shown in FIG. 19, the designation codes for the operation pictures displayed on the CRT 54 are stored in the ROM 52b or the RAM 52c. By then inputting the enter command in the way described above, a designation code corresponding to the cursor position is read out and then transmitted from the remote controller. However, a command code corresponding to the actual operation contents designated by the enter input is stored in a region of the memory area 39 in the remote controller 30 to which the designation code has been assigned as an address without modification.

In order to do this, if a designation code is received by the remote controller 30, this is assigned as an address code and sent to the memory area 39 and the controller/generator 35 then controls it's reading out from the memory area 39. In this way, a command code corresponding to the designated operation can be read out (F708, F709). At this time, in order to connect the output selector 36 to the terminal SW2, the command code which was read out is sent to the infra red transmitter 37 where it is changed to an infra red signal before being output.

This transmission output is then transmitted to equipment arranged about the periphery. For example, if the system is in possession of the command codes for VTR 61, these can be received by the receiver 61a for the VTR 61 and the desired operations for VTR 61 can be executed. In the same way, if the command codes for the compact disc player 62 are possessed, these can be received by the receiver 62a for the compact disc player 62, or if the command codes for the TV tuner 63 are possessed, these can be received by the receiver 63a for the TV tuner 63 and the respective operations for these items of equipment can be executed. Naturally, this also applies for other equipment.

After the controller/generator for the remote controller 30 has read the command code from the memory area 39 and then transmitted it, it is confirmed that the operating of the enter key 33 has stopped (F711), and the output selector 36 is changed over to terminal SW1.

For the case where the pressing of the enter key is continued, the command code is read without modification from the memory area 39 and it's transmission is continued (F711–F710). This, for example, is for operations such as fast forward, rewind and picture search which occur in videos where it is necessary to continue the providing of the command code.

This kind of remote control system, as with the system in the first embodiment, provides a remote controller 30 which is extremely easy to operate. Also, as there is a small number of operating keys and their operation is not perplexing. Further, as operations can be carried out while looking at the picture, its operation is not troublesome. In addition to this, as the remote controller 30 is for operating the position designation input area 50, it is not necessary to expand the directivity of the infra red receiver 55 in the position designation input area 50.

Also, as the up, down and enter commands for designating the operation pictures displayed on the screen and the command data read out from the memory area 39 for controlling the actual equipment are output with different timings and so are not output as a mixed signal, appropriate remote operation can be achieved.

Here, for the case where this embodiment possesses a learning function, the new command code is written into the memory area 39 of the remote controller 30. In this way, the memory key 34 and the write-in input 40 for the remote controller 30 can be set up.

While the learning operation is being carried out, the user can shift the cursor with respect to the operation pictures displayed on the CRT 54 by transmitting up and down signals. When the command code for the operation picture which is desired to be changed over to is indicated, the memory key 34 is operated (F701–F702). When this is done, the controller/generator 35 embarks upon the learning operation process shown in FIG. 18.

The controller/generator 35 reads out the enter command in response to the on operation of the memory key. This signal is then transmitted, to be inputted to the controller 52 for the position designated input area 50 (F901).

The controller 52 then receives the enter input by the process shown in FIG. 17(b) (F804), reads out the designation code corresponding to the current position indicated by the cursor K and transmits this signal (F807, F808).

If this designation code is received by the remote controller 30 (F902), this is written into the memory area 39 as address data, and the inputting of the command data which the user would like to write in is waited for (F903).

Here, the user transmits the command code which is desired to be learned into the write-in input using another remote controller. The controller generator 35 then stores this command code in the address position in the memory 39 assigned by the inputted designated code. (F904).

A learning function can therefore also be realized for this embodiment by the process described above. Now, although a detailed description of this is omitted, this embodiment does not only have a changeover function, but can also, for example, have command expansion function. Here, the command display characters for that which it is desired to expand on the side of the position designation input area 50 is input and a designation code for an address region of the memory area 39 which is not being used is generated. This address position can then be used to store a new command code output from another remote controller.

Now, it is not necessary for this designation code outputted by the controller 52 to be made an address code for the memory area 39. However, by making this an address code, the system construction on the side of the remote controller 30 can be made simple. A changeover process is then not necessary for the excess code.

Embodiments of this invention were described above but this invention is by no means limited to the specific structures described in these embodiments and various modifications are possible.

For example, the remote controller and the position input designation area do not have to employ the wireless method, and the transmission of the command codes could instead be carried out via hard wiring.

The remote controller shown had the minimum of three operation keys, an up key, a down key and an enter key. However, for example, the up and down operation area could be made into a roll operation area and the direction of roll rotation could be realized by the up and down keys. Further, by setting up items such as angular sensors or acceleration sensors within the controller, up and down information could be transmitted from the remote controller by moving the controller up, down, left or right.

Also, a CRT monitor was connected and used as the display equipment, but this could be replaced with, for example, a liquid crystal display or a tube incorporated into the position designation input area, or put in a separate unit.

In the way described above, the remote control system for this invention can operate the various operation functions for various items of equipment while only utilizing a small number of operation keys. This makes the operation very easy for the user so that the operation of the key intended to be pushed is no longer perplexing or troublesome.

Also, in addition to the small number of operation keys, operation can be carried out while looking at the picture on the monitor so that further hindrances are erased as it is no longer necessary to glance at the remote controller.

Further, it is also now very easy to expand the amount of equipment which can be a target for the remote controller. In these ways, a remote control system which is extremely easy to use is provided.

What is claimed is:

1. A system for remotely controlling a selected device including a remote controller and a central controller, said remote controller comprising:

input means having only an up operation key, a down operation key, and an enter key;

position generating means for generating a position designation information in accordance with a user operation of said input means; and position transmitting means for transmitting said position designation information; and a central controller comprising:

receiving means for receiving said position designation information transmitted from said remote controller;

storage means for storing various command codes;

command generating means for generating desired command code from said storage means corresponding to said position designation information;

command transmitting means for transmitting the desired command code which is outputted from the command generating means to said selected device; and display control means for displaying and controlling an operation picture signal and a position designation picture signal in accordance with said position designation information received from said remote controller, said display control means forming a first viewing area and a second viewing area on a display screen, wherein said display control means displays said operation picture signal and said position designation picture signal in said first viewing area and a video signal from said selected device on said second viewing area providing an unobstructed view of said signals in said first and second viewing areas simultaneously.

2. The system according to claim 1, further comprising:

character inputting means for inputting command character information;

external command inputting means for receiving and inputting command codes output from said device, said display control means being operable to display an operation picture corresponding to a region of said storage means where a command code is not stored so that the command character information inputted from said character inputting means is displayed as said operation picture; and said storage means storing the command code inputted from said external command code inputting means in a region where a command code is not stored, so as to correspond with said operation picture displayed according to said position designation information;

whereby said operation picture with command code corresponding thereto is added into said first viewing area.

3. The system according to claim 1, further comprising external command inputting means for receiving and inputting command codes output from said device, wherein said display control means is operable to rewrite the command code, which is stored corresponding with a selected operation, with a command code inputted from said external command inputting means.

4. The system according to claim 1, further comprising:

input selector means for selecting and outputting one signal from among the signals provided by a plurality of connected devices; and selector operating means for carrying out the selecting operation for said input selector means, wherein said display control means is operable, in response to the operation of said selector operating means, to output operation picture signals corresponding to one or more command codes stored in said storage means as the command code or codes for the device selected by said input selector means from among said plurality of connected devices.

5. The system according to claim 1, further comprising input selecting means for selecting and outputting one signal from among the signals provided by a plurality of connected devices, said storage means containing at least the command codes for carrying out the selecting operation for said input selecting means, said display control means being operable to output the operation picture signal corresponding to the command code for the selecting operation of said input selecting means based on the position designation information transmitted from said input means and received by said receiving means.

6. The system according to claim 1, further comprising input selecting means for selecting and outputting one signal from among the signals provided by a plurality of connected devices, said storage means storing command codes for carrying out the selecting operation of said input selecting means and command codes for each connected device, said display control means being operable to display outputs in separate display positions on said display means for a first operation picture signal corresponding to a command code for the selecting operation of said input selecting means and a second operation picture signal corresponding to a command code for each connected device, said input selecting means being operable to perform the selecting operation for a designation while one of the operation pictures from said first operation picture signal is being designated by a position designation picture based on position designation information received at said receiving means from said input means, and for said second operation picture signal, an operation picture signal corresponding to the command code for the device selected by said selecting means is outputted by said display control means.

7. The system according to claim 1, wherein said command generating means provides a direct control of an audio or a video input selector or a picture input selector based on the command code.

8. The system according to claim 1, wherein said operation picture signal causes said display means to display a picture and said position designation signal causes said display means to display a cursor.

9. A system including a remote controller and a central controller for remotely controlling a selected device, said remote controller comprising:

input means having only an up operation key, a down operation key, and an enter key;

information generating means for generating a position designation information and a selection information in accordance with a user operation of said input means;

code receiving means for receiving a designation code from said central controller;

converting means for converting said received designation code into a remote control signal; and transmitting means for transmitting said position designation information, said selection information, and said remote control signal; and said central controller comprising:

information receiving means for receiving said position designation information and said selection information transmitted from said remote controller;

storage means for storing various designation codes;

code generating means for generating said desired designation code from said storage means corresponding to said position designation information and said selection information; and code transmitting means for transmitting said desired designation code to said remote controller;

wherein said remote controller transmits said remote control signal to said selected device based on said received designation code whereby said selected device is controlled in accordance with said remote control signal from said remote controller.

10. The system according to claim 9, said central controller further including a display control means for displaying an operation picture signal and a position designation picture signal in accordance with said position designation information, said display control means forming a first viewing area and a second viewing area on a display screen;

wherein said display control means displays said operation picture signal and said position designation picture signal in said first viewing area and a video signal from said selected device on said second viewing area providing an unobstructed view of said signals in said first and second viewing areas simultaneously.

11. The system according to claim 9, wherein said designation code is an address code for the region of said storage means for said input means in which the command codes intended to be read out is stored.

12. The system according to claim 9, wherein the position designation information and command codes are selectively supplied to said transmission means for said input means at different times.

* * * * *